(12) United States Patent
Sasahara et al.

(10) Patent No.: US 11,127,597 B2
(45) Date of Patent: Sep. 21, 2021

(54) ETCHING METHOD

(71) Applicant: TOKYO ELECTRON LIMITED, Tokyo (JP)

(72) Inventors: Reiko Sasahara, Nirasaki (JP); Satoshi Toda, Nirasaki (JP); Takuya Abe, Nirasaki (JP); Tsuhung Huang, Hsin-chu (TW); Yoshie Ozawa, Nirasaki (JP); Ken Nakagomi, Nirasaki (JP); Kenichi Nakahata, Nirasaki (JP); Kenshiro Asahi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/617,992

(22) PCT Filed: Mar. 28, 2018

(86) PCT No.: PCT/JP2018/012689
§ 371 (c)(1),
(2) Date: Nov. 27, 2019

(87) PCT Pub. No.: WO2018/220973
PCT Pub. Date: Dec. 6, 2018

(65) Prior Publication Data
US 2020/0111674 A1    Apr. 9, 2020

(30) Foreign Application Priority Data

May 30, 2017 (JP) .............................. JP2017-106743
Aug. 25, 2017 (JP) .............................. JP2017-162179

(51) Int. Cl.
  *H01L 21/311* (2006.01)
  *H01L 21/02* (2006.01)
  *H01L 21/3105* (2006.01)

(52) U.S. Cl.
  CPC .... *H01L 21/31116* (2013.01); *H01L 21/0206* (2013.01); *H01L 21/02359* (2013.01); *H01L 21/31056* (2013.01)

(58) Field of Classification Search
  CPC   B29C 48/12; B29K 2023/12; B29K 2077/00; B29K 2309/08; B29L 2031/005;
  (Continued)

(56) References Cited

U.S. PATENT DOCUMENTS

2011/0061810 A1*  3/2011  Ganguly ........... H01L 21/67207
                                                156/345.27
2011/0287600 A1* 11/2011  Cheng ............. H01L 21/823425
                                                438/299

(Continued)

FOREIGN PATENT DOCUMENTS

JP    2003-347279 A   12/2003
JP    2005-39185 A    2/2005
(Continued)

*Primary Examiner* — Lan Vinh
(74) *Attorney, Agent, or Firm* — Nath, Goldberg & Meyer; Jerald L. Meyer; Tanya E. Harkins

(57) ABSTRACT

There is provided an etching method including: a step of disposing a substrate in a chamber, the substrate having a silicon nitride film, a silicon oxide film, a silicon, and a silicon germanium; a step of setting a pressure in the chamber to 1,333 Pa or more; and a step of selectively etching the silicon nitride film with respect to the silicon oxide film, the silicon, and the silicon germanium by supplying a hydrogen fluoride gas into the chamber.

15 Claims, 15 Drawing Sheets

(58) Field of Classification Search
CPC ... C23C 14/0641; C23C 14/205; C23C 14/35; E06B 2003/26372; E06B 2003/26387; E06B 3/26; E06B 3/26303; H01L 21/67069; H01L 21/67167; H01L 21/67184; H01L 21/31116; H01L 21/76807; H01L 21/76813; H01L 21/76829; H01L 23/5226; H01L 23/5329; H01L 21/0206; H01L 21/02359; H01L 21/3105; H01L 21/6708; H01L 21/67086
USPC ....... 438/700, 710, 712, 714, 719, 723, 725, 438/736, 759, 766, 738
See application file for complete search history.

(56) References Cited

U.S. PATENT DOCUMENTS

| | | | | |
|---|---|---|---|---|
| 2013/0048605 | A1* | 2/2013 | Sapre | H01L 21/3086 216/51 |
| 2017/0093130 | A1* | 3/2017 | Gassenq | H01L 33/105 |

FOREIGN PATENT DOCUMENTS

| | | | |
|---|---|---|---|
| JP | 2007-214513 | A | 8/2007 |
| JP | 2008-160000 | A | 7/2008 |
| JP | 2012-89805 | A | 5/2012 |
| JP | 2012-119539 | A | 6/2012 |
| JP | 2014-63847 | A | 4/2014 |
| JP | 2014-197603 | A | 10/2014 |
| JP | 2015-73035 | A | 4/2015 |

* cited by examiner

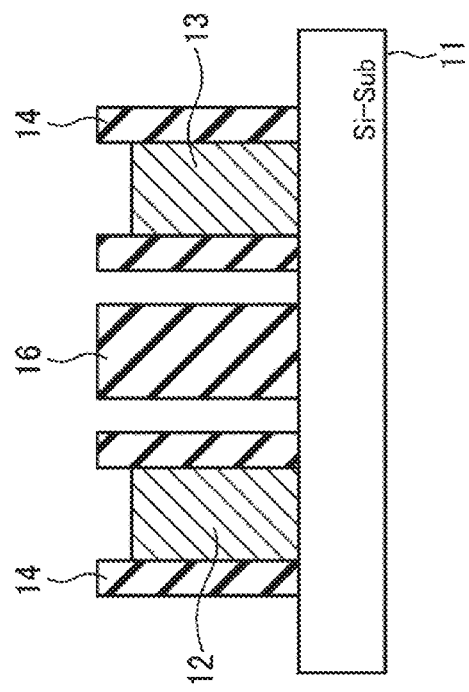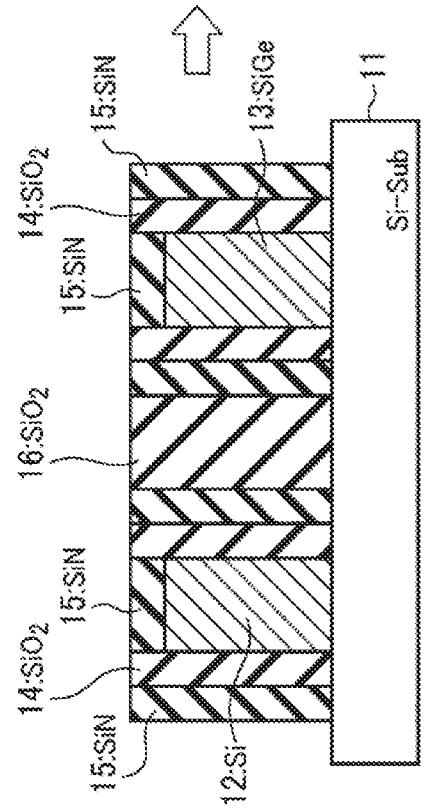

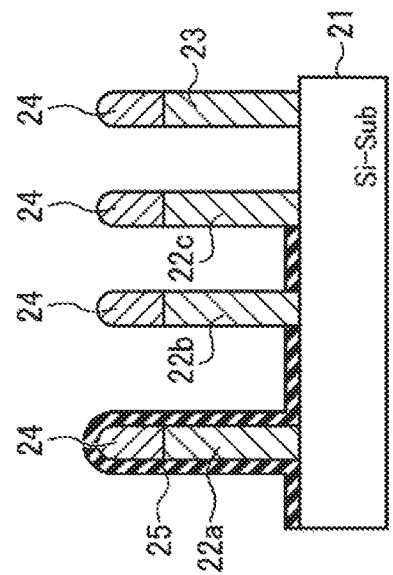
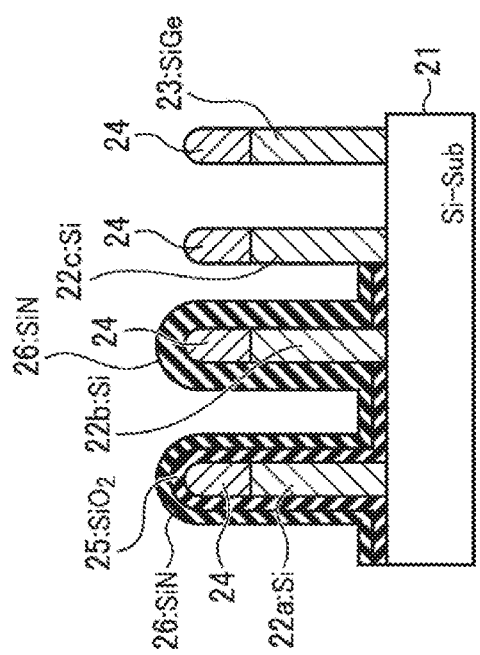

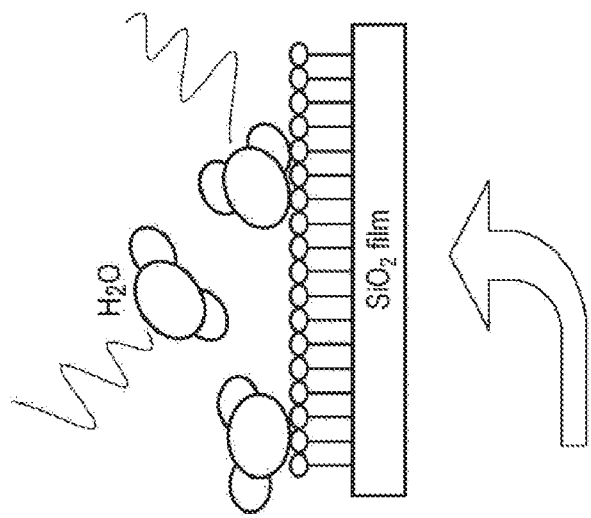
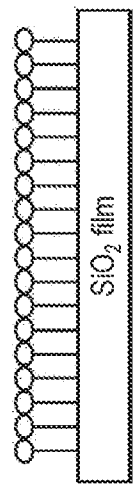
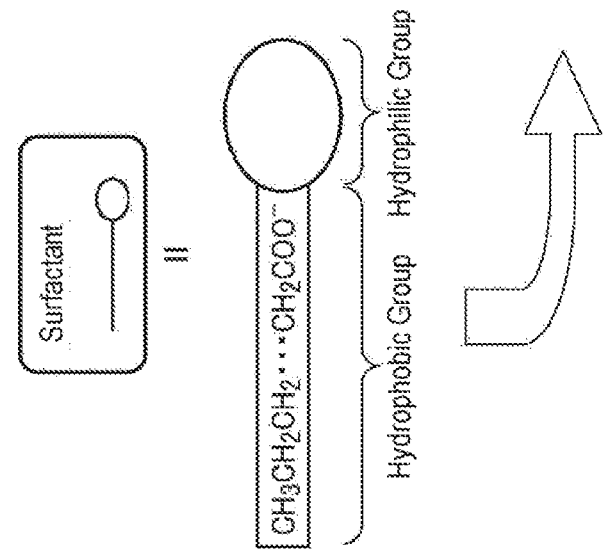

ETCHING METHOD

This is a National Phase Application filed under 35 U.S.C. 371 as a national stage of PCT/JP2018/012689, filed Mar. 28, 2018, an application claiming the benefit of Japanese Application No. 2017-106743, filed May 30, 2017 and Japanese Application No. 2017-162179, filed Aug. 25, 2017, the content of each of which is hereby incorporated by reference in its entirety.

TECHNICAL FIELD

The present disclosure relates to an etching method.

BACKGROUND

Recently, miniaturization etching has been performed in the process of manufacturing semiconductor devices, but a chemical etching technique capable of low-damage etching is attracting attention as a dry etching technique that is replacing conventional plasma etching. For example, a chemical oxide removal (COR) technique is used for etching a silicon oxide ($SiO_2$) film using a mixture gas of hydrogen fluoride (HF) gas and ammonia ($NH_3$) gas as a processing gas (see e.g., Patent Documents 1 and 2).

Recently, application of such a chemical etching technique to etching of a silicon nitride (SiN) film has been studied.

Since a SiN film is often located adjacent to a $SiO_2$ film, as a technique for selectively etching the SiN film with respect to the $SiO_2$ film, Patent Document 3 discloses performing etching by supplying HF gas, $F_2$ gas, an inert gas, and $O_2$ gas in an excited state.

PRIOR ART DOCUMENTS

Patent Documents

Patent Document 1: Japanese Laid-Open Patent Publication No. 2005-39185
Patent Document 2: Japanese Laid-Open Patent Publication No. 2008-160000
Patent Document 3: Japanese Laid-Open Patent Publication No. 2015-73035

SUMMARY

The present disclosure provides an etching method capable of etching a silicon nitride (SiN) film with high selectivity to a silicon oxide ($SiO_2$) film, silicon (Si), and silicon germanium (SiGe).

According to another embodiment of the present disclosure, there is provided an etching method including: disposing a substrate in a chamber, the substrate having a silicon nitride film, a silicon oxide film, silicon, and silicon germanium; setting a pressure in the chamber to 1,333 Pa or more; and selectively etching the silicon nitride film with respect to the silicon oxide film, the silicon, and the silicon germanium by supplying a hydrogen fluoride gas into the chamber.

According to the present disclosure, an etching method capable of etching a silicon nitride (SiN) film with high selectivity to a silicon oxide ($SiO_2$) film, silicon (Si), and silicon germanium (SiGe) is provided.

BRIEF DESCRIPTION OF DRAWINGS

FIGS. 1A and 1B are cross-sectional process views when etching of a SiN film is performed on a structure example to which an etching method of a first embodiment is applied.

FIGS. 2A and 2B are cross-sectional process views when etching of a SiN film is performed on another structure example to which the etching method of the first embodiment is applied.

FIGS. 7A to 7C are views for explaining the function of a surfactant used for a surface modification treatment.

DETAILED DESCRIPTION

Figure 3:
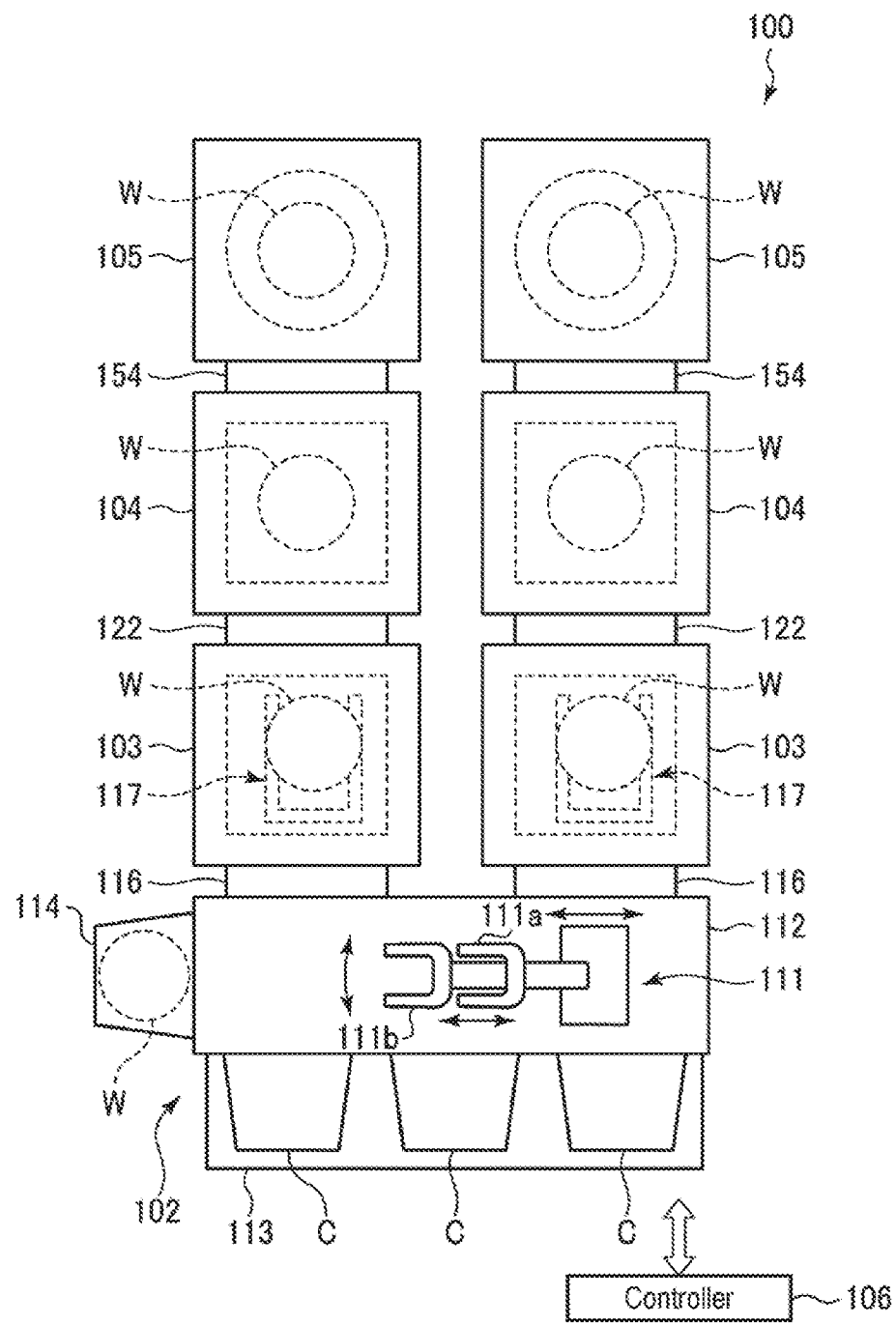
FIG. 3 is a schematic configuration view illustrating an exemplary processing system used for the etching method according to the first embodiment.

Hereinafter, embodiments will be described in detail with reference to the drawings.

Background

First, the background of an etching method of the present disclosure will be described.

As described above, performing etching of a SiN film through chemical etching similar to the COR technique has been studied recently. For example, Patent Document 3 describes a technique of selectively etching a SiN film with respect to a $SiO_2$ film by supplying HF gas, $F_2$ gas, an inert gas, and $O_2$ gas in an excited state.

However, in the case of etching a SiN film in a semiconductor device using Si and SiGe, such as a CMOS transistor, with the technique disclosed in Patent Document 3, it is difficult to etch a SiN film with sufficient selectivity to all of the $SiO_2$ film, Si, and SiGe.

In addition, when the $SiO_2$ film contains impurities such as H and N, the $SiO_2$ film may be damaged when the SiN film is etched in Patent Document 3 described above.

Accordingly, the inventors conducted various studies to solve these problems. As a result, it has been found that by etching the silicon nitride film at a high pressure using HF gas, it is possible to etch the silicon nitride film with high selectivity to a silicon oxide ($SiO_2$) film, silicon (Si), and silicon germanium (SiGe). It has also been found that when etching of a SiN film is performed on a substrate having the SiN film and a $SiO_2$ film thereon, it is effective to perform a surface modification treatment for removing impurities or the like in the films prior to etching the silicon nitride film.

First Embodiment

Next, a first embodiment of the present disclosure will be described.

In this embodiment, a method for etching and removing a SiN film formed adjacent to $SiO_2$, Si, and SiGe will be described.

Structure Example to which Etching Method of First Embodiment is Applied

FIGS. 1A and 1B are cross-sectional process views when etching of a SiN film is performed on a structure example to which the etching method of the first embodiment is applied. FIG. 1A is a structure example to which the etching method of this embodiment is applied. In the structure of FIG. 1A, a pole-shaped Si film 12 and SiGe film 13 are formed on a silicon substrate 11. In addition, first $SiO_2$ films 14 are formed around the Si film 12 and around the SiGe film 13, and SiN films 15 are formed around the first $SiO_2$ film 14 and on the Si film 12 and the SiGe film 13. In addition, a second $SiO_2$ film 16 is formed between the SiN film 15 around the Si side and the SiN film 15 around the SiGe side. The SiN films 15 having the structure illustrated in FIG. 1A are etched to form a desired semiconductor device. In this case, ideally, it is required to etch the SiN films 15 in a state in which only the SiN films 15 are removed, as illustrated in FIG. 1B, that is, with high selectivity to the Si film 12, the SiGe film 13, and the first and second $SiO_2$ films 14 and 16.

FIGS. 2A and 2B are a cross-sectional process view when etching of a SiN film is performed on another structure example to which the etching method of the first embodiment is applied. FIG. 2A illustrates another example of a structure to which the etching method of this embodiment is applied. In the structure of FIG. 2A, a first Si film 22a, a second Si film 22b, and a third Si film 22c, each of which has a pole shape, are provided on the silicon substrate 21 from the left side, and a pole-shaped SiGe film 23 is formed on the right side. A hard mask 24 remains on the first to third Si films 22a to 22c and the SiGe film 23. A $SiO_2$ film 25 is formed on the silicon substrate 21 from the periphery of the first Si film 22a and the end portion on the first Si film 22a side to the third Si film 22c. Then, a SiN film 26 is provided on the $SiO_2$ film 25 and around the second Si film 22b. The SiN film 26 having the structure illustrated in FIG. 2A is etched to form a desired semiconductor device. In this case, ideally, it is required to etch the SiN film 26 in a state in which only the SiN film 26 is removed as illustrated in FIG. 2B, that is, with high selectivity to the first to third Si films 22a to 22c, the SiGe film 23, and the $SiO_2$ film 25. Specifically, an etching selectivity ratio (hereinafter, also referred to as "the selection ratio") to $SiO_2$ is required to be 5 or more, and an etching selectivity ratio (the selection ratio) to Si and SiGe is required to be 50 or more.

For example, films formed through epitaxial growth or polycrystalline films formed through CVD may be used as the Si film 12, the first to third Si films 22a to 22c, and the SiGe films 13 and 23. In addition, the first and second $SiO_2$ films 14 and 16 and the $SiO_2$ film 25 may be films formed by chemical vapor deposition (CVD), films formed by atomic layer deposition (ALD), or thermal oxide films. There are various methods for forming an $SiO_2$ film through CVD, and the amount of hydrogen (H), carbon (C), nitrogen (N) and the like contained as impurities differs depending on the methods, and a low-grade CVD-$SiO_2$ film contains a relatively large amount of impurities. Similarly, an ALD-$SiO_2$ film contains these impurities. Meanwhile, a thermal oxide film contains few such impurities.

A SiN film to be etched is formed through thermal CVD, plasma CVD, ALD, or the like using a silane-based gas such as $SiH_4$ gas, $SiH_2Cl_2$, or $Si_2Cl_6$ and a nitrogen-containing gas such as $NH_3$ gas or $N_2$ gas.

Etching of SiN Film of First Embodiment

When the SiN film is formed adjacent to $SiO_2$, Si, and SiGe as illustrated in the above device example, (1) a method of performing etching in a COR apparatus using HF gas or HF gas+$NH_3$ gas, (2) a method of performing etching by adding $F_2$ to this gas system, and (3) a method performed through radical SiN etching have been performed as an attempt to etch the SiN film with a high selection ratio.

The COR processing of method (1) is usually performed at a relatively low pressure of 4 Torr (532 Pa) or lower, but the SiN/$SiO_2$ selection ratio is smaller than 2. In the case of method (2), the SiN/$SiO_2$ selection ratio is improved, but the selection ratio to Si is not obtained. In addition, in the case of radical SiN etching of method (3), the SiN/$SiO_2$ selection ratio is obtained, but the SiN/SiGe selection ratio is not obtained.

Accordingly, a method capable of etching the SiN film with a high selection ratio to all of $SiO_2$, Si, and SiGe was examined, and it has been found that it is effective to use HF gas and to increase the pressure to 1,333 Pa (10 Torr) or higher. The reason that a high selection ratio can be obtained by setting the high-pressure state in this manner is that the effect of increasing the adsorption efficiency of the HF gas is obtained by setting the high pressure.

Details will be described below.

The etching of SiN of this embodiment is performed by accommodating, for example, a semiconductor wafer (which will also be simply referred to as a wafer) having the above-described structure in a chamber and introducing only HF gas or a mixture gas of HF gas and inert gas into the chamber. As the inert gas, $N_2$ gas or a rare gas such as Ar or He may be used.

At this time, the flow rate of HF gas is preferably 200 to 3,000 sccm, and the flow rate of the inert gas is preferably 200 to 3,000 sccm.

The pressure in the chamber at this time is set to a high pressure of 1,333 Pa (10 Torr) or more as described above. Preferably, the high pressure is 1,333 to 11,997 Pa (10 to 90 Torr). More preferably, the high pressure is 1,333 to 5,332 Pa (10 to 40 Torr).

The wafer temperature at this time is preferably 10 to 120 degrees C. Below 10 degrees C. and above 120 degrees C., it may be difficult to obtain a desired selection ratio. More preferably, it is 30 to 80 degrees C.

After the above-described etching of the SiN film is terminated, etching residues and the like are removed as necessary, and the processing is terminated.

By performing the etching of the SiN film for a predetermined time depending on the thickness of the SiN film under the above-described conditions, it is possible to etch the SiN with high selectivity of a selection ratio of 5 or more to $SiO_2$ and with high selectivity of a selection ratio of 50 or more to Si and SiGe. The selection ratio to $SiO_2$ is preferably 15 or more, and the selection ratio to Si and SiGe is preferably 100 or more.

Exemplary Processing System Used for First Embodiment

Next, an exemplary processing system used for the first embodiment will be described.

FIG. 3 is a schematic configuration view illustrating an exemplary processing system used for the first embodiment. The processing system 100 includes a loading/unloading part 102, two load-lock chambers 103, two heat treatment apparatuses 104, two etching apparatuses 105, and a controller 106. The loading/unloading part 102 is for loading/unloading a wafer W having the structure illustrated in the above-described structure example. The two load-lock chambers 103 are provided adjacent to the loading/unloading part 102. The two heat treatment apparatuses 104 are provided adjacent to the load-lock chambers 103, respectively, and are configured to perform heat treatment on a wafer W. The two etching apparatuses 105 are provided adjacent to the respective heat treatment apparatuses 104, and configured to perform etching on a wafer W.

The loading/unloading part 102 has a transport chamber 112 in which a first wafer transport mechanism 111 for transporting a wafer W is provided. The first wafer transport mechanism 111 has two transport arms 111a and 111b for holding a wafer W substantially horizontally. On the side portion in the long side direction of the transport chamber 112, a placement stage 113 is provided, to which, for example, three carriers C for storing a plurality of wafers W such as FOUPs are capable of being connected. In addition, adjacent to the transport chamber 112, an alignment chamber 114 is provided to perform alignment of a wafer W.

In the loading/unloading part 102, a wafer W is held by the transport arms 111a and 111b, and is rectilinearly moved in a substantially horizontal plane and moved up and down by the driving of the first wafer transport mechanism 111 so as to be transported to a desired position. Then, loading/unloading is performed by making each of the transport arms 111a and 111b advance and retract with respect to a carrier C on the placement stage 113, the alignment chamber 114, and a load-lock chamber 103.

Each load-lock chamber 103 is connected to the transport chamber 112 with a gate valve 116 interposed therebetween. In each load-lock chamber 103, a second wafer transport mechanism 117 for transporting a wafer W is provided. In addition, the load-lock chamber 103 is configured to be capable of being evacuated to a predetermined degree of vacuum.

The second wafer transport mechanism 117 has an articulated arm structure, and has a pick for holding a wafer W substantially horizontally. In the second wafer transport mechanism 117, the pick is positioned in the load-lock chamber 103 in a state in which the articulated arm is contracted. By extending the articulated arm, the pick is capable of reaching the heat treatment apparatus 104, and by further extending the articulated arm, the pick is capable of reaching the etching apparatus 105. Thus, it is possible to transport a wafer W between the load-lock chamber 103, the heat treatment apparatus 104, and the etching apparatus 105.

The controller 106 is typically constituted with a computer, and includes a main controller having a CPU for controlling each component of the processing system 100, an input device (e.g., a keyboard or a mouse), an output device (e.g., a printer), a display device (e.g., a display), and a storage device (a storage medium). The main controller of the controller 106 causes the processing system 100 to execute a predetermined operation based on, for example, a processing recipe stored in, for example, a storage medium embedded in the storage device or a storage medium set in the storage device.

In such a processing system 100, a plurality of wafers W on each of which the above-described structure is formed are stored in a carrier C and transported to the processing system 100. In the processing system 100, one wafer W is transported by any of the transport arms 111a and 111b of the first wafer transport mechanism 111 from the carrier C of the loading/unloading part 102 to the load-lock chamber 103 in a state in which an atmosphere-side gate valve 116 is opened, and is delivered to the pick of the second wafer transport mechanism 117 in the load-lock chamber 103.

Thereafter, the atmosphere-side gate valve 116 is closed to evacuate the interior of the load-lock chamber 103, the gate valve 154 is subsequently opened, and the pick is extended to the etching apparatus 105 to transport the wafer W to the etching apparatus 105.

Thereafter, the pick is returned to the load-lock chamber 103, the gate valve 154 is closed, and the etching processing of a SiN film is performed by the etching method described above in the etching apparatus 105.

After the etching processing is terminated, the gate valves 122 and 154 are opened, the wafer W subjected to the etching processing is transported to the heat treatment apparatus 104 by the pick of the second wafer transport mechanism 117, and etching residues or the like are removed by heating.

After the etching is terminated in the heat treatment apparatus 104, the wafer W is returned to the carrier C by any of the transport arms 111a and 111b of the first wafer transport mechanism 111. In this manner, the processing of one wafer is completed.

In the case in which it is not necessary to remove etching residues or the like, the heat treatment apparatus 104 may not be provided. In that case, after the etching processing is terminated, the wafer W may be retracted to (stored in) the load-lock chamber 103 by the pick of the second wafer transport mechanism 117, and may be returned to the carrier C by any of the transport arms 111a and 111b of the first wafer transport mechanism 111.

Etching Apparatus

Next, an exemplary etching apparatus 105 for carrying out the etching method according to this embodiment will be described in detail.

Figure 4:
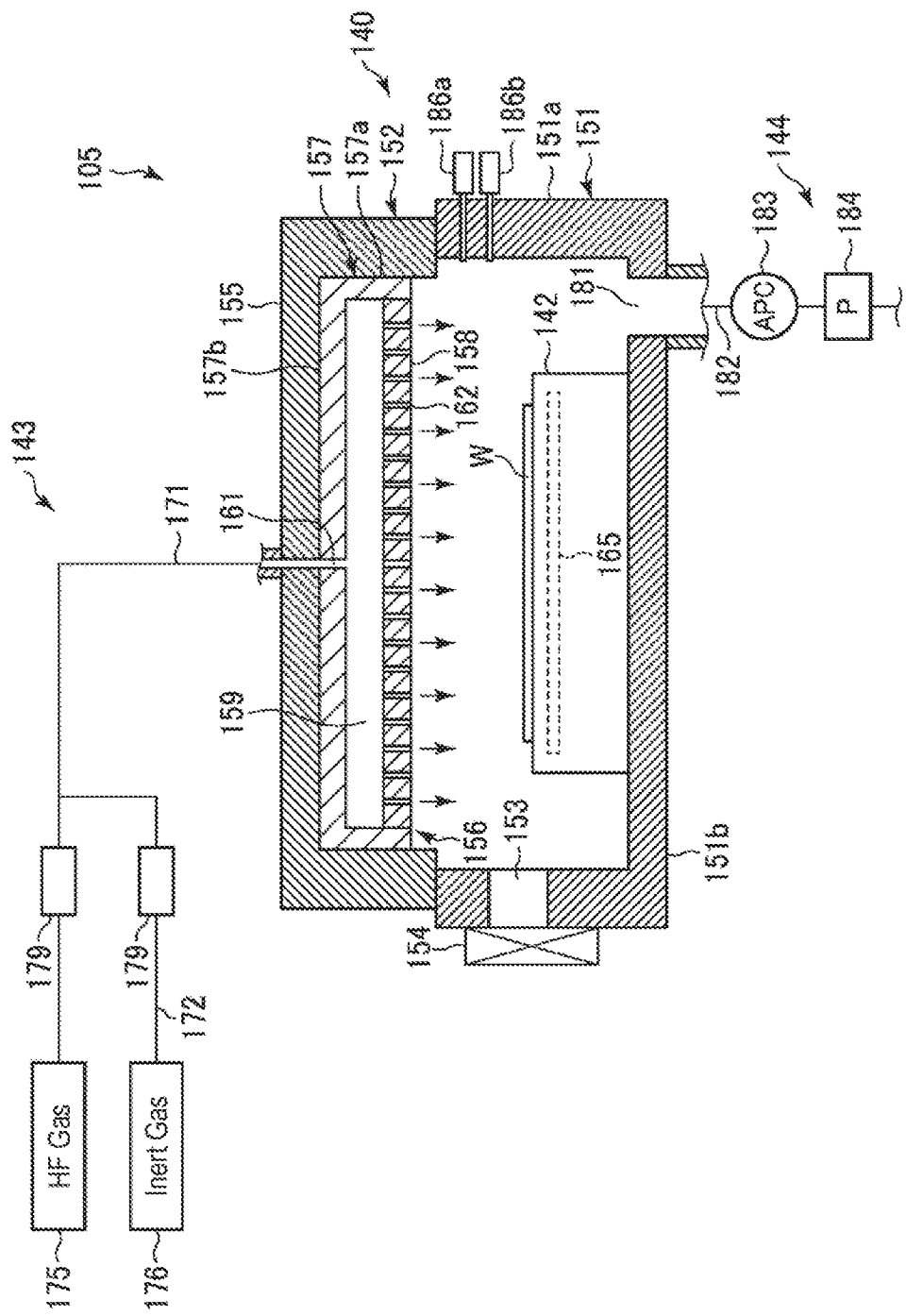
FIG. 4 is a cross-sectional view illustrating an etching apparatus provided in the processing system of FIG. 3.

FIG. 4 is a cross-sectional view illustrating the exemplary etching apparatus 105. As illustrated in FIG. 4, the etching apparatus 105 includes a chamber 140 having a sealed structure as a processing container, and is provided with a placement stage 142 on which a wafer W is placed in a substantially horizontal state inside the chamber 140. The etching apparatus 105 further includes a gas supply mechanism 143 that supplies an etching gas to the chamber 140 and an exhaust mechanism 144 that exhausts the interior of the chamber 140.

The chamber 140 is constituted with a chamber body 151 and a cover 152. The chamber body 151 has a substantially cylindrical side wall portion 151*a* and a bottom portion 151*b*, and has an opening in the upper portion thereof that is closed by the cover 152. The side wall portion 151*a* and the cover 152 are sealed by a sealing member (not illustrated) to ensure the airtightness of the interior of the chamber 140.

The cover 152 has a cover member 155 forming the external side, and a shower head 156 inserted into the cover member 155 and provided to face the placement stage 142. The shower head 156 has a main body 157 having a cylindrical side wall 157*a* and an upper wall 157*b*, and a shower plate 158 provided in the bottom portion of the main body 157. A space 159 is formed between the main body 157 and the shower plate 158.

A gas introduction path 161 is formed in the cover member 155 and the upper wall 157*b* of the main body 157 while penetrating to the space 159, and a HF gas supply pipe 171 of the gas supply mechanism 143, which will be described later, is connected to the gas introduction path 161.

A plurality of gas ejection holes 162 are formed in the shower plate 158, and the gas introduced into the space 159 through the gas supply pipe 171 and the gas introduction path 161 is ejected from the gas ejection holes 162 into the space in the chamber 140.

The side wall portion 151*a* is provided with a loading/unloading port 153 for loading/unloading a wafer W with respect to a heat treatment apparatus 104, and the loading/unloading port 153 is configured to be capable of being opened/closed by a gate valve 154.

The placement stage 142 has a substantially circular shape in a plan view, and is fixed to the bottom portion 151*b* of the chamber 140. Inside the placement stage 142, a temperature adjuster 165 for adjusting the temperature of the placement stage 142 is provided. The temperature adjuster 165 includes, for example, a pipeline through which a temperature adjustment medium (e.g., water) circulates, and heat exchange is performed with the temperature adjustment medium flowing in the pipeline, whereby the temperature of the placement stage 142 is adjusted, so that the temperature of the wafer W on the placement stage 142 is controlled.

The gas supply mechanism 143 includes a HF gas supply source 175 for supplying HF gas and an inert gas supply source 176 for supplying an inert gas. One end of the HF gas supply pipe 171 and one end of an inert gas supply pipe 172 are connected to the HF gas supply source 175 and the inert gas supply source 176, respectively. The HF gas supply pipe 171 and the inert gas supply pipe 172 are each provided with a flow rate controller 179 configured to perform an opening/closing operation of a flow path and flow rate control. The flow rate controller 179 is constituted with, for example, an opening/closing valve and a mass flow controller. The other end of the HF gas supply pipe 171 is connected to the gas introduction path 161, as described above. In addition, the other end of the inert gas supply pipe 172 is connected to the HF gas supply pipe 171.

Accordingly, the HF gas is supplied from the HF gas supply source 175 via the HF gas supply pipe 171 to the shower head 156, and the inert gas is supplied from the inert gas supply source 176 to the shower head 156 via the inert gas supply pipe 172 and the HF gas supply pipe 171. These gases are ejected from the gas ejection holes 162 of the shower head 156 toward the wafer W in the chamber 140.

Of these gases, the HF gas is a reactive gas, and the inert gas is used as a dilution gas and a purge gas. It is possible to obtain a desired etching performance by supplying the HF gas alone or by mixing and supplying the HF gas and the inert gas.

The exhaust mechanism 144 has an exhaust pipe 182 connected to an exhaust port 181 formed in the bottom portion 151*b* of the chamber 140. The exhaust mechanism 144 includes an automatic pressure control valve (APC) 183 provided in the exhaust pipe 182 to control the pressure in the chamber 140 and a vacuum pump 184 configured to evacuate the chamber 140.

Two capacitance manometers 186*a* and 186*b* are provided on the side wall of the chamber 140 as pressure gauges for measuring the pressure in the chamber 140 so as to be inserted into the chamber 140. The capacitance manometer 186*a* is provided for high pressure, and the capacitance manometer 186*b* is provided for low pressure. In the vicinity of the wafer W placed on the placement stage 142, a temperature sensor (not illustrated) is provided so as to detect the temperature of the wafer W.

In such an etching apparatus 105 described above, a wafer W having the above-described structure is loaded into the chamber 140, and is placed on the placement stage 142. In addition, the temperature of the wafer W is set to preferably 10 to 120 degrees C., and more preferably 30 to 80 degrees C. by the temperature adjuster 165 of the placement stage 142. The pressure in the chamber 140 is set to 1,333 Pa (10 Torr) or higher, preferably in the range of 1,333 to 11,997 Pa (10 to 90 Torr), and more preferably in the range of 1,333 to 5,332 Pa (10 to 40 Torr). Then, the HF gas and the inert gas are both supplied preferably at a flow rate of 200 to 3,000 sccm to etch a SiN film.

Second Embodiment

Next, a second embodiment of the present disclosure will be described.

This embodiment includes a step of removing a SiN film by etching, as in the first embodiment. In this embodiment, an etching method is described in which even when impurities such as N and H are contained in a $SiO_2$ film adjacent to a SiN film, the $SiO_2$ film is hardly damaged when the SiN film is etched.

First Example of Etching Method of Second Embodiment

First, a basic example of this embodiment will be described as a first example of the second embodiment. In this example, etching of a SiN film is performed on a wafer on which the SiN film is formed adjacent to a $SiO_2$ film containing predetermined impurities.

In the case in which impurities such as H and N are contained in the $SiO_2$ film, it has been found that, when a SiN film adjacent thereto is etched using HF gas as it is, the gas components such as H and N in the impurities contained in the $SiO_2$ film react with HF during the etching of the SiN film. When these gas components react with HF during the etching of the SiN film, the $SiO_2$ film may be etched unevenly, and damage such as pitting defects (holes) or surface roughness may occur. For example, in the case of a $SiO_2$ film formed through CVD or ALD, H, N, C, and the like derived from a film forming source gas are present in the film, there is a risk of damage during the etching of the SiN film. In particular, when the annealing temperature of a $SiO_2$ interlayer insulating film formed through CVD or ALD is low, the interlayer insulating film is easily damaged during the etching of the SiN film due to the low density thereof in addition to the presence of impurities. In addition, the $SiO_2$ film formed through fluid chemical vapor deposition (F-CVD) is also easily damaged during the etching of the SiN film due to a large amount of impurities described above and the low density thereof.

When a $SiO_2$ film adjacent to a SiN film is etched, in addition to the impurities originally contained, the components infiltrating into the film during etching and gas components attached to the wafer W without being completely removed are present. During the etching of the SiN film, the $SiO_2$ film is easily damaged by etching due to the HF and the attached gas components. In particular, when the $SiO_2$ film is removed through COR, there is a possibility that $NH_3$ and F of the gas components are contained in the film in addition to the impurities such as H, N, and C, and that highly reactive byproducts such as $NH_4$ and $HF_2$ are attached to the wafer W. Since they coexist with HF during the etching of the SiN film, the $SiO_2$ film is easily etched. As described above, when the $SiO_2$ film is a CVD film or an ALD film, impurities are present. Further, depending on the film formation method, the film tends to have a large amount of impurities and a low density. For this reason, in addition to gas components and reaction products existing during the etching of the $SiO_2$ film, damage to the $SiO_2$ film due to the etching of the SiN film becomes more extensive.

Figure 5A:
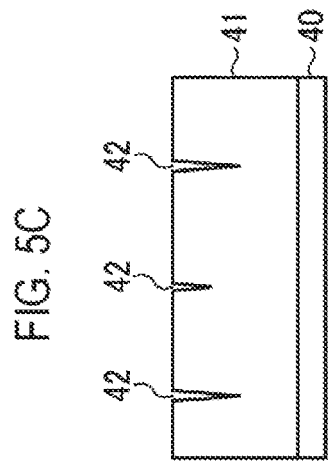
FIGS. 5A to 5C are views for explaining a mechanism in which a $SiO_2$ film is damaged when a SiN film adjacent to the $SiO_2$ film containing impurities is etched with HF gas.
Figure 5B:
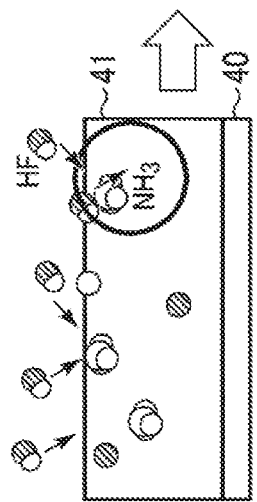
Figure 5C:
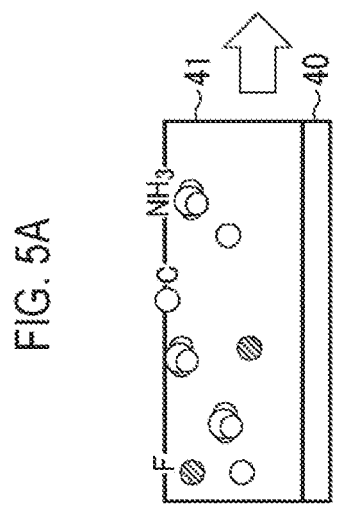

An example is illustrated in FIGS. 5A to 5C. FIGS. 5A to 5C are views for explaining a mechanism in which a $SiO_2$ film is damaged when a SiN film adjacent to the $SiO_2$ film containing impurities is etched with HF gas. As illustrated in FIG. 5A, a $SiO_2$ film 41, formed on a Si substrate 40 through FCVD and etched by COR, contains C, F, $NH_3$, and the like as impurities in the surface layer portion of the film. When the etching of the SiN film is performed using HF gas as the etching gas in this state, as illustrated in FIG. 5B, HF as the etching gas and $NH_3$ in the film react with Si in $SiO_2$, whereby ammonium fluorosilicate (($NH_4)_2$ $SiF_6$; AFS) is produced. By the subsequent heat treatment, as illustrated in FIG. 5C, ammonium fluorosilicate is volatilized and pitting defects 42 are formed in the $SiO_2$ film 41. This also causes surface roughness on the surface of the $SiO_2$ film 41. Similarly, when byproducts such as $NH_4$ or $HF_2$ are attached to the $SiO_2$ film 41, pitting defects or surface roughness occur.

Figure 6:
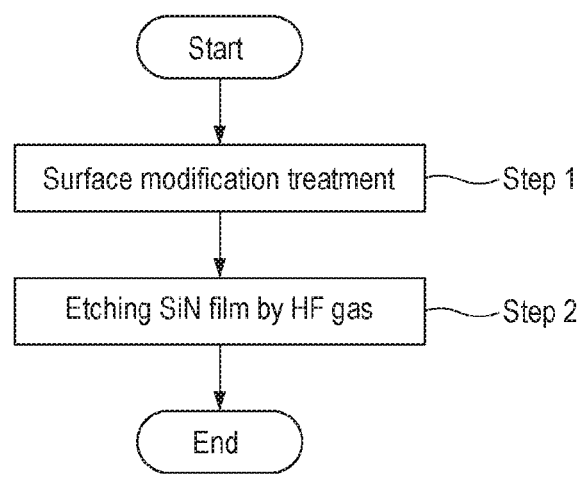
FIG. 6 is a flowchart illustrating a first example of an etching method according to a second embodiment.

Therefore, in the first example of this embodiment, as illustrated in the flowchart of FIG. 6, first, a surface modification treatment is performed on a wafer (Step 1), and then the SiN film is etched with HF gas (Step 2).

The surface modification treatment in Step 1 is for removing impurities such as $NH_3$, F, and C in the film or byproducts such as $NH_4$ and $HF_2$ attached to the wafer W. By removing these through the surface modification treatment, the $SiO_2$ film becomes difficult to etch by the subsequent SiN film etching.

The surface modification treatment includes a dry treatment in which heat treatment is performed in an inert atmosphere. The temperature at that time is preferably 150 to 400 degrees C., for example, 250 degrees C. By this treatment, impurities such as $NH_3$, F, and C in the film or byproducts such as $NH_4$ and $HF_2$ attached to the wafer W may be removed by thermal decomposition or volatilization. In addition, as the dry treatment, other treatments, such as radical treatment, may also be used.

In addition, as the surface modification treatment, reaction treatment using $H_2O$ may be performed. By this treatment, it is possible to remove impurities in the film or byproducts attached to the wafer W by reacting the impurities and byproducts with $H_2O$. The temperature at this time is preferably 20 to 100 degrees C., and more preferably 20 to 80 degrees C. As the reaction treatment using $H_2O$, dry treatment using an atmosphere containing $H_2O$ vapor may be performed, or wet treatment, performed by immersion in liquid $H_2O$ (pure water) or supplying of liquid $H_2O$ (pure water), may be performed.

Furthermore, the surface modification treatment may also be performed through a treatment including a step of adsorbing a surfactant on the wafer surface and a wet cleaning step using $H_2O$ (pure water).

When a hydrophobic portion exists on the surface of a $SiO_2$ film, in a simple wet treatment using $H_2O$, $H_2O$ may not reach the hydrophobic portion, and thus the $H_2O$ treatment may be insufficient in that portion. Thus, the situation in which impurities in the film or reaction products attached to the film are not sufficiently removable may occur. In contrast, the entire surface of the wafer surface may be made hydrophilic by causing the surfactant to be adsorbed on the wafer surface. Therefore, the cleaning performance in the subsequent wet cleaning using $H_2O$ (pure water) is good, and thus it is possible to effectively remove impurities in the $SiO_2$ film or reaction products attached to the $SiO_2$ film.

FIGS. 7A to 7C are views for explaining the function of a surfactant used for surface modification treatment. As illustrated in FIG. 7A, the surfactant has a hydrophobic group and a hydrophilic group in one molecule, and has a function of making a hydrophobic state compatible with water via the hydrophobic group. In addition, as illustrated in FIG. 7B, the surfactant is capable of being adsorbed on the entire surface of a $SiO_2$ film such that hydrophilic groups are arranged on the outside. For this reason, as illustrated in FIG. 7C, $H_2O$ (pure water) is supplied to the entire surface of the $SiO_2$ film to perform $H_2O$ cleaning with good cleaning property, and thus it is possible to effectively remove impurities in the $SiO_2$ film or the reaction products attached to the $SiO_2$ film.

The step of adsorbing the surfactant on the wafer may be performed by immersing the wafer in the surfactant or by applying the surfactant to the wafer. At this time, the surfactant may be a stock solution or an aqueous solution. Further, the wet cleaning step using $H_2O$ (pure water) may be performed by immersing the wafer in pure water or supplying pure water to the wafer.

Etching of the SiN film in Step 2 is performed by introducing only HF gas or a mixture gas of HF gas and an inert gas into the chamber and setting the pressure to a high pressure of 1,333 Pa (10 Torr) or higher as in the first embodiment. Preferably, the high pressure is 1,333 to 11,997 Pa (10 to 90 Torr). More preferably, the high pressure is 1,333 to 5,332 Pa (10 to 40 Torr). As the inert gas, $N_2$ gas or a rare gas such as Ar or He may be used.

As in the first embodiment, at this time, it is preferable that the flow rate of HF gas be 200 to 3,000 sccm and that the flow rate of the inert gas be 200 to 3,000 sccm. In addition, the wafer temperature is preferably 10 to 120 degrees C., and more preferably 30 to 80 degrees C.

After the above-described etching of the SiN film is terminated, etching residues and the like are removed as necessary, and the processing is terminated.

By the above-described processing, it is possible to etch the SiN film with a high selection ratio of 15 or more to the $SiO_2$ film, and it is possible to suppress damage (e.g., pitting defects or surface roughness) of the $SiO_2$ film during the etching of the SiN film.

In addition, in the case in which Si or SiGe is also present adjacent to the SiN film, it is possible to etch the SiN film with a high selection ratio of 50 or more as in the first embodiment.

Second Example of Etching Method of Second Embodiment

Next, an application example of this embodiment will be described as a second example.

Structure Example to Which Second Example is Applied

Figure 8:
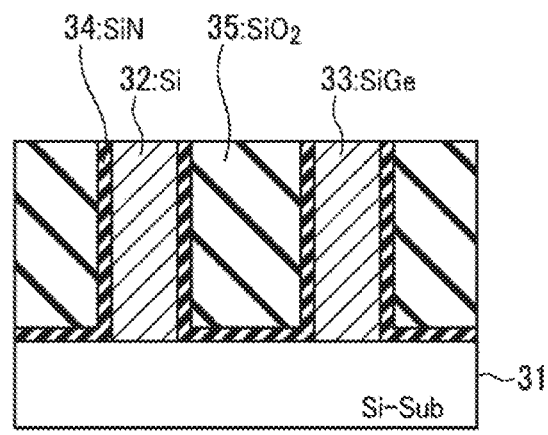
FIG. 8 is a cross-sectional view illustrating a structure example to which a second example of the etching method of the second embodiment is applied.

As a structure example to which the etching method of the second example of this embodiment is applied, the structure illustrated in FIG. 8 may be referred to. In the structure of FIG. 8, a pole-shaped Si film 32 and SiGe film 33 are formed on a silicon substrate 31, a thin SiN film 34 is formed around the Si film 32 and around the SiGe film 33, and a $SiO_2$ film 35 is formed around the SiN film 34 so as to cover the entire SiN film 34.

Etching Method of Second Example

Figure 9:
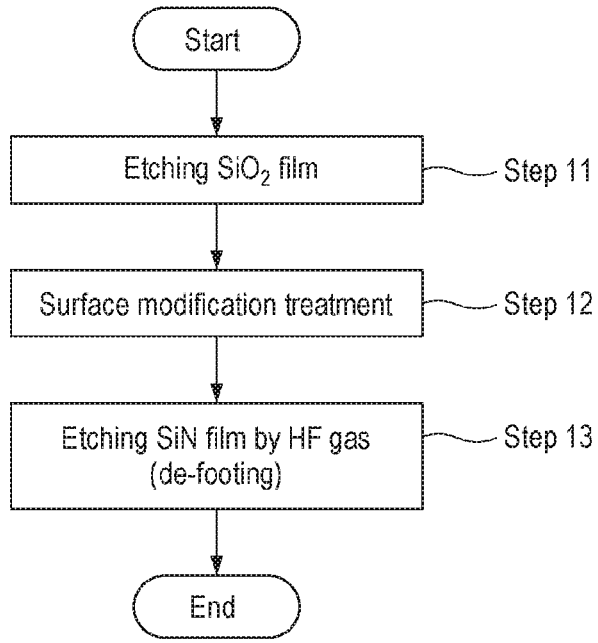
FIG. 9 is a flowchart illustrating the second example of the etching method according to the second embodiment.
Figure 10A:
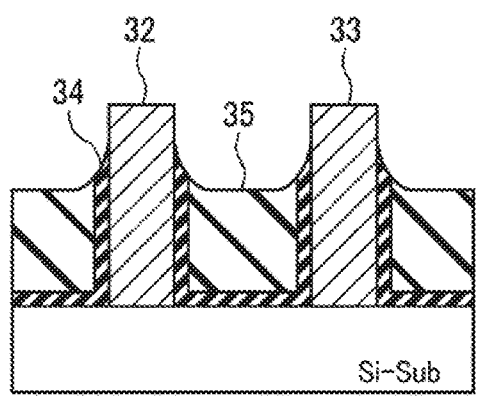
FIGS. 10A and 10B are cross-sectional process views in the second example of the etching method of the second embodiment.
Figure 10B:
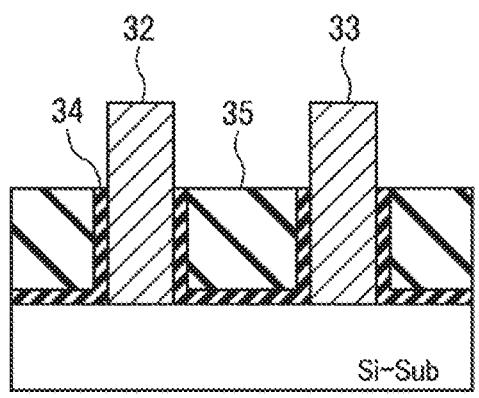

The etching method of the second example of this embodiment is performed on the structure of FIG. 8 as illustrated in the flowchart of FIG. 9 and the cross-sectional process views of FIGS. 10A and 10B.

First, the $SiO_2$ film 35 of FIG. 8 is etched (Step 11).

The etching of the $SiO_2$ film 35 may be performed through COR using HF gas and $NH_3$ gas by accommodating a wafer having the structure illustrated in FIG. 8 in a chamber. At this time, it is preferable that the pressure be 133 to 400 Pa (1 to 3 Torr), that the processing temperature be 10 to 130 degrees C., that the flow rate of HF gas be 20 to 1,000 sccm, that the flow rate of $NH_3$ gas be 20 to 1,000 sccm, and that the flow rate of inert gas be 20 to 1,000 sccm. By this COR processing, ammonium fluorosilicate (($NH_4)_2SiF_6$; AFS) is generated, and thus the AFS is sublimated by heating to complete the etching. The sublimation of AFS may be performed using a separate heating apparatus, or etching and heat treatment may be repeatedly performed in the COR chamber, and the removal of AFS may be performed therein.

Further, the etching of the $SiO_2$ film 35 may be performed by radical treatment. At this time, F radicals and N radicals formed by activating a mixture gas of $NF_3$ and $NH_3$ may be used as radicals.

As illustrated in FIG. 10A, the $SiO_2$ film 35 is removed to a predetermined height position through the etching of Step 11, and the SiN film 34 remains at a position higher than a predetermined height position. For this reason, etching (de-footing) for removing the footing areas of the SiN film 34 is performed.

At this time, when the SiN film is etched as it is on the wafer W after the etching of the $SiO_2$ film 35, there is a possibility that a film other than the SiN film 34, mainly the $SiO_2$ film 35, is etched, thereby causing damage such as pitting defects or surface roughness. This damage is caused when impurities contained in the $SiO_2$ film 35, components infiltrated into the film during the etching of the $SiO_2$ film 35, and gas components attached to the wafer W without being completely removed react with HF during the etching of the SiN film. In particular, when the $SiO_2$ film 35 is removed through COR, there is a possibility that $NH_3$ and F in the gas components are contained in the film in addition to impurities such as H, N, and C, and that highly reactive byproducts, such as $NH_4$ and $HF_2$, are attached to the wafer W. Since they coexist with HF during the etching of the SiN film, the $SiO_2$ film 35 is easily etched. As described above, when the $SiO_2$ film is a film formed by CVD or ALD, this tendency is remarkable because there is a tendency for a large amount of impurities to exist in the film and the density thereof is also low depending on the film forming method.

Therefore, also in this example, after the $SiO_2$ film 35 is etched, a surface modification treatment is performed (Step 12).

The surface modification treatment is for removing impurities in the film or byproducts such as $NH_4$ and $HF_2$ attached to the wafer W. This makes it difficult for the $SiO_2$ film 35 to be etched during the subsequent etching of the SiN film 34.

As in the first example, the surface modification treatment is performed by a heat treatment in an inert atmosphere, a reaction treatment using $H_2O$, or a treatment including a step of adsorbing a surfactant on the wafer surface and a wet cleaning step using $H_2O$ (pure water). In addition, as the surface modification treatment, other treatment such as a radical treatment may be used.

After performing such surface modification treatment, etching (de-footing) of the footing areas of the SiN film 34 is performed (Step 13).

The etching is performed by accommodating a wafer having the structure illustrated in FIG. 10A, introducing only HF gas or a mixture gas of HF gas and an inert gas into the chamber, and setting the pressure to a high pressure of 1,333 Pa (10 Torr) or higher as in the first embodiment. Preferably, the high pressure is 1,333 to 11,997 Pa (10 to 90 Torr). More preferably, the high pressure is 1,333 to 5,332 Pa (10 to 40 Torr). As the inert gas, $N_2$ gas or a rare gas such as Ar or He may be used. However, in this embodiment, in the case where the surface modification treatment is performed and thus, particularly, the etching of the $SiO_2$ film 35 is performed by the radical treatment, there is a possibility that the etching of the SiN film may be performed with a high selection ratio even if the pressure is lower than 1,333 Pa (10 Torr).

In this etching, it is preferable that the flow rate of HF gas be 200 to 3,000 sccm and that the flow rate of inert gas be 200 to 3,000 sccm, as in the first embodiment. In addition, the wafer temperature is preferably 10 to 120 degrees C., and more preferably 30 to 80 degrees C.

This makes it possible to obtain a desired semiconductor device by removing the footing areas of the SiN film 34 by etching, as illustrated in FIG. 10B.

After the above-described etching of the SiN film is terminated, etching residues and the like are removed through a heat treatment or the like as necessary, and the processing is terminated.

According to this example, after the $SiO_2$ film 35 is removed by etching, impurities in the film or byproducts such as $NH_4$ and $HF_2$ attached to the wafer W are removed through surface modification treatment. As a result, in the subsequent etching of the SiN film 34, it is possible to etch the SiN film 34 with a high selection ratio to the $SiO_2$ film 35, the Si film 32, and the SiGe film 33 in a state in which the occurrence of the damage (pitting defects or surface roughness) due to the etching of $SiO_2$ film 35 under the influence of the impurities or byproducts is prevented. The selection ratio at this time is 5 or more, preferably 15 or more, to $SiO_2$, and 50 or more, preferably 100 or more, to Si and SiGe. Therefore, it is possible to obtain a semiconductor element having the structure illustrated in FIG. 10B with high accuracy. In particular, even when the $SiO_2$ film 35 is formed through CVD (e.g., FCVD), which is a method of forming a film having a relatively large amount of impurities and a low density, it is possible to suppress etching of the $SiO_2$ film 35, and thus it is possible to increase the selection ratio of the SiN film 34 to the $SiO_2$ film 35.

Exemplary Processing System Used for Second Embodiment

Next, an exemplary processing system used for the second embodiment will be described.

Figure 11:
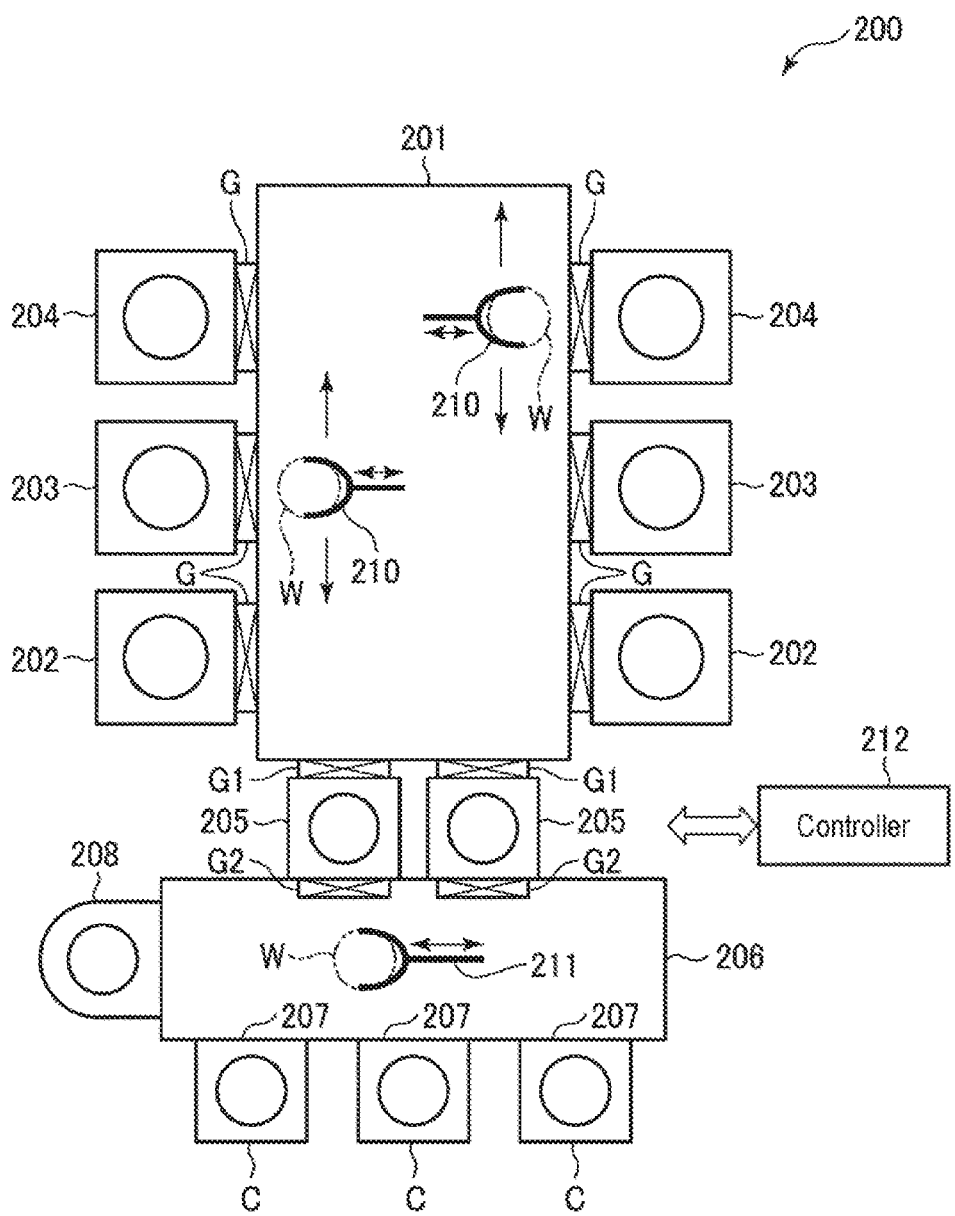
FIG. 11 is a schematic configuration view illustrating an exemplary processing system used for the etching method of the second example of the second embodiment.

FIG. 11 is a schematic configuration view illustrating an exemplary processing system used for the etching method of the second example of the second embodiment. The processing system 200 includes a vacuum transport chamber 201 having a rectangular cross section. An oxide film etching apparatus 202 for etching a $SiO_2$ film, a surface modification treatment apparatus 203, and a SiN film etching apparatus 204 are installed in one of the long sides of the vacuum transport chamber 201 and connected to the vacuum transport chamber 201 via gate valves G. Similarly, an oxide film etching apparatus 202, a surface modification treatment apparatus 203, and a SiN film etching apparatus 204 are also connected to the other of the long sides of the vacuum transport chamber 201 and connected to the vacuum transport chamber 201 via gate valves G. The interior of the vacuum transport chamber 201 is evacuated by a vacuum pump and is maintained at a predetermined degree of vacuum.

The oxide film etching apparatus 202 may be configured as a COR apparatus that performs etching of the $SiO_2$ film by COR. The oxide film etching apparatus 202 may be a radical treatment apparatus.

The surface modification treatment apparatus 203 may be configured as a heat treatment apparatus that performs heat treatment on a wafer W at a relatively high temperature. Moreover, the surface modification treatment apparatus 203 may be an $H_2O$ gas treatment apparatus that performs heat treatment on the wafer W in an $H_2O$ gas atmosphere. Furthermore, as the surface modification treatment apparatus 203, another treatment apparatus such as a radical treatment apparatus may be used.

The SiN film etching apparatus 204 may be configured like the etching apparatus 105 in the first embodiment.

Two load-lock chambers 205 are connected to one of the short sides of the vacuum transport chamber 201 via gate valves G1. An atmospheric transport chamber 206 is provided on the side opposite the vacuum transport chamber 201 with the load-lock chambers 205 interposed therebetween. The load-lock chambers 205 are connected to the atmospheric transport chamber 206 via gate valves G2. The load-lock chambers 205 perform pressure control between the atmospheric pressure and the vacuum when a wafer W is transported between the atmospheric transport chamber 206 and the vacuum transport chamber 201.

In the wall of the atmospheric transport chamber 206 opposite the wall on which the load-lock chambers 205 are mounted, three carrier-mounting ports 207 are provided, in each of which a carrier (a FOUP or the like) C for accommodating a plurality of wafers W is mounted. In addition, on a side wall of the atmospheric transport chamber 206, an alignment chamber 208 is provided to perform alignment of a wafer W. In the atmospheric transport chamber 206, a downflow of clean air is formed.

In the vacuum transport chamber 201, two wafer transport mechanisms 210 are provided. One wafer transport mechanism 210 is configured to be capable of performing loading/unloading of a wafer W with respect to the oxide film etching apparatus 202, the surface modification treatment apparatus 203, the SiN film etching apparatus 204, which are connected to one of the long sides of the vacuum transport chamber 201, and one load-lock chamber 205. The other wafer transport mechanism 210 is configured to be capable of performing loading/unloading of a wafer W with respect to the oxide film etching apparatus 202, the surface modification treatment apparatus 203, the SiN film etching apparatus 204, which are connected to the other of the long sides of the vacuum transport chamber 201, and the other load-lock chamber 205.

In the atmospheric transport chamber 206, a wafer transport mechanism 211 is provided. The transport mechanism 211 transports a wafer W with respect to the carriers C, the load-lock chambers 205, and the alignment chamber 208.

The processing system 200 has a controller 212. The controller 212 is typically constituted with a computer, and includes a main controller having a CPU for controlling each component of the processing system 200, an input device (e.g., a keyboard or a mouse), an output device (e.g., a printer), a display device (e.g., a display), and a storage device (a storage medium). The main controller of the controller 212 causes the processing system 200 to execute a predetermined operation based on, for example, a processing recipe stored in, for example, a storage medium embedded in a storage device or a storage medium set in a storage device.

In this processing system 200, a plurality of wafers W, each having the structure of FIG. 8 formed thereon, are accommodated in a carrier C and transported to the processing system 200. In the processing system 200, a wafer W is taken out from the carrier C connected to the atmospheric transport chamber 206 by the wafer transport mechanism 211, and the gate valve G2 of any one of the load-lock chambers 205 is opened to transport the wafer W to the load lock chamber 205. After closing the gate valve G2, the interior of the load-lock chamber 205 is evacuated.

When the load-lock chamber 205 reaches a predetermined degree of vacuum, the gate valve G1 is opened, and the wafer W is taken out from the load-lock chamber 205 by the wafer transport mechanism 210. Then, the gate valve G of the oxide film etching apparatus 202 is opened, the wafer W is loaded into the oxide film etching apparatus 202, and the etching of the $SiO_2$ film is performed. When the etching of the $SiO_2$ film is performed by COR processing, AFS is generated as described above. Therefore, in order to sublimate the AFS, a heat treatment is performed by the surface modification treatment apparatus 203 or a separately provided heat treatment apparatus. Alternatively, an etching and a heat treatment may be repeatedly performed in the oxide film etching apparatus 202 so as to remove the AFS in the oxide film etching apparatus 202.

After the etching of the $SiO_2$ film is terminated, the wafer W is taken out by the wafer transport mechanism 210, the gate valve G of the surface modification treatment apparatus 203 is opened, the wafer W is carried into the surface modification treatment apparatus 203, and a surface modification treatment is performed.

After the surface modification treatment of the wafer W is terminated, the wafer W is taken out by the wafer transport mechanism 210, the gate valve G of the SiN film etching apparatus 204 is opened, the wafer W is carried into the SiN film etching apparatus 204, and the etching of the SiN film is performed.

After the etching of the SiN film, etching residues are removed by the surface modification treatment apparatus 203, a separately provided heat treatment apparatus, or the like, as necessary.

Thereafter, the gate valve G1 of the load-lock chamber 205 is opened, and the wafer W, in which etching of the SiN film has been performed, is carried into the load-lock chamber 205 by the wafer transport mechanism 210. Then, the gate valve G1 is closed, and the interior of the load-lock chamber 205 is returned to the atmospheric pressure. Thereafter, the gate valve G2 is opened, and the wafer W in the load-lock chamber 205 is returned to the carrier C by the wafer transport mechanism 211.

The processing described above is performed simultaneously on a plurality of wafers W in parallel, so that the processing of a predetermined number of wafers W is completed.

Next, examples of the oxide film etching apparatus 202 and the surface modification treatment apparatus 203 will be described. Since the SiN film etching apparatus 204 has the same configuration as the etching apparatus 105 of the first embodiment, a description thereof is omitted.

Oxide Film Etching Apparatus

First, an exemplary oxide film etching apparatus 202 will be described.

Figure 12:
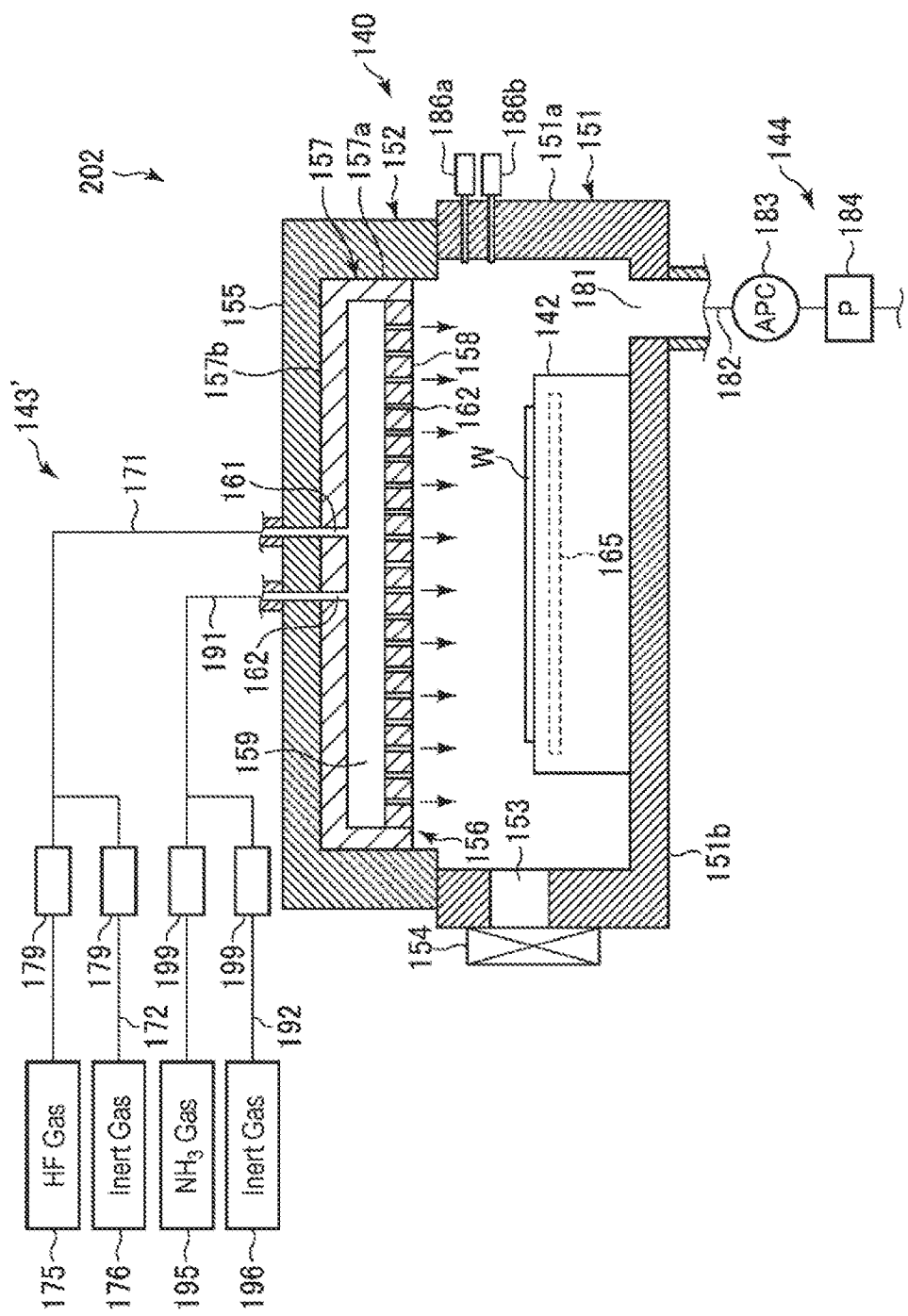
FIG. 12 is a cross-sectional view illustrating an oxide film etching apparatus provided in the processing system of FIG. 11.

FIG. 12 is a cross-sectional view illustrating the exemplary oxide film etching apparatus 202. In this example, a COR processing apparatus that etches a $SiO_2$ film through COR processing will be described as an example. In this case, since the basic configuration of the apparatus is the same as that of the etching apparatus 105 in the first embodiment, components that are the same as those in FIG. 4 will be denoted by the same reference numerals, and a description thereof will be omitted.

In the oxide film etching apparatus 202, in addition to the gas introduction path 161, a gas introduction path 162 is also formed in the upper wall 157b of the cover member 155 and the main body 157 while penetrating to the space 159 of the shower head 156. A HF gas supply pipe 171 of a gas supply mechanism 143', which will be described later, is connected to the gas introduction path 161. In addition, an $NH_3$ gas supply pipe 191 is connected to the gas introduction path 162.

The gas supply mechanism 143' includes a HF gas supply source 175 for supplying HF gas and an inert gas supply source 176 for supplying an inert gas. One end of the HF gas supply pipe 171 and one end of the inert gas supply pipe 172 are connected to the HF gas supply source 175 and the inert gas supply source 176, respectively. The HF gas supply pipe 171 and the inert gas supply pipe 172 are each provided with a flow rate controller 179. The other end of the HF gas supply pipe 171 is connected to the gas introduction path 161. In addition, the other end of the inert gas supply pipe 172 is connected to the HF gas supply pipe 171.

The gas supply mechanism 143' includes an $NH_3$ gas supply source 195 for supplying $NH_3$ gas, and an inert gas supply source 196 for supplying an inert gas. One end of the $NH_3$ gas supply pipe 191 and one end of the inert gas supply pipe 192 are connected to the $NH_3$ gas supply source 195 and the inert gas supply source 196, respectively. The $NH_3$ gas supply pipe 191 and the inert gas supply pipe 192 are each provided with a flow rate controller 199, which is configured like the flow rate controller 179. The other end of the $NH_3$ gas supply pipe 191 is connected to the gas introduction path 162. In addition, the other end of the inert gas supply pipe 192 is connected to the $NH_3$ gas supply pipe 191.

Accordingly, the HF gas is supplied from the HF gas supply source 175 into the shower head 156 via the HF gas supply pipe 171, and the $NH_3$ gas is supplied from the $NH_3$ gas supply source 195 into the shower head 156 via the $NH_3$ gas supply pipe 191. The inert gas flows from the inert gas supply sources 176 and 196 to the HF gas supply pipe 171 and the $NH_3$ gas supply pipe 191 via the inert gas supply pipes 172 and 192, respectively, and is supplied to the shower head 156. Then, these gases are ejected from the gas ejection holes 162 of the shower head 156 toward the wafer W in the chamber 140.

The HF gas and $NH_3$ gas are used as reaction gases, and the inert gas is used as a dilution gas and a purge gas. A desired reaction may be caused by supplying the HF gas and the $NH_3$ gas, or a mixture of the HF gas, the $NH_3$ gas and an inert gas.

In this oxide film etching apparatus 202, for example, a wafer W, on which the structure illustrated in FIG. 8 is formed, is loaded into the chamber 140 and placed on the placement stage 142. Then, it is preferable that the pressure in the chamber 140 be set to 133 to 400 Pa (1 to 3 Torr), and that the processing temperature be set to 10 to 130 degrees C. The flow rates of HF gas, $NH_3$ gas, and inert gas are all set to preferably 20 to 1,000 sccm, and these gases are supplied such that the HF gas and the $NH_3$ gas react with $SiO_2$ to generate AFS. Then, the $SiO_2$ film is removed by heating the wafer W in an appropriate apparatus.

Surface Modification Treatment Apparatus

Next, an exemplary surface modification treatment apparatus 203 will be described.

Figure 13:
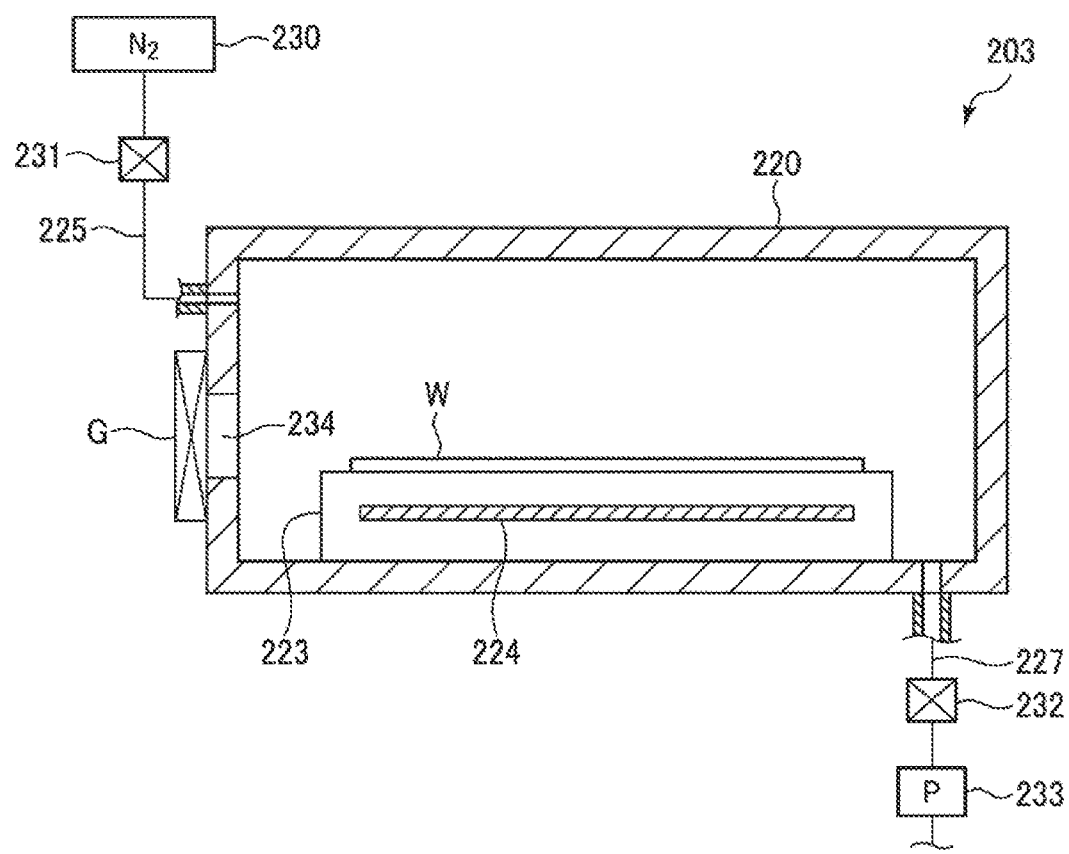
FIG. 13 is a cross-sectional view illustrating a surface modification treatment apparatus provided in the processing system of FIG. 11.

FIG. 13 is a cross-sectional view illustrating the exemplary surface modification treatment apparatus 203.

In this example, as the surface modification treatment apparatus 203, a heat treatment apparatus that removes impurities in a film or byproducts by heat treatment will be described by way of an example.

As illustrated in FIG. 13, the surface modification treatment apparatus 203 has a chamber 220 configured to be capable of being evacuated and a placement stage 223 on which the wafer W is placed in the chamber 220. A heater 224 is embedded in the placement stage 223, and the wafer W, having been subjected to the etching processing of the $SiO_2$ film, is heated by the heater 224 to remove impurities existing in the film or byproducts attached to the surface of the wafer W through thermal decomposition or volatilization. A loading/unloading port 234 is installed in the side surface of the chamber 220 to transport a wafer with respect to the vacuum transport chamber 201, and the loading/unloading port 234 is configured to be capable of being opened/closed by a gate valve G. A gas supply path 225 is connected to the upper portion of the side wall of the chamber 220, and the gas supply path 225 is connected to the inert gas supply source 230. In addition, an exhaust path 227 is connected to the bottom wall of the chamber 220, and the exhaust path 227 is connected to the vacuum pump 233. A flow rate adjustment valve 231 is installed in the gas supply path 225, and a pressure adjustment valve 232 is installed in the exhaust path 227. By adjusting these valves, a $N_2$ gas atmosphere at a predetermined pressure is formed in the chamber 220, and heat treatment is performed therein. As the inert gas, a $N_2$ gas or a rare gas such as Ar gas may be used.

In such a surface modification treatment apparatus 203, for example, a wafer W, having the structure illustrated in FIG. 10A through the etching of the $SiO_2$ film, is loaded into the chamber 220 and placed on the placement stage 223. Then, an inert gas such as $N_2$ gas is introduced into the chamber 220 to form a predetermined decompressed atmosphere, and the wafer W is heated to 150 to 400 degrees C., for example, 250 degrees C., by the heater 224. This enables impurities in the film or byproducts such as $NH_4$ and $HF_2$ attached to the wafer W to be thermally decomposed or volatilized.

By introducing $H_2O$ vapor into the chamber 220 and by performing reaction treatment preferably at 20 to 100 degrees C., and more preferably at 20 to 80 degrees C., impurities in the film or byproducts attached to the wafer W may be caused to react with $H_2O$ gas, so that they are removed.

In this example, an example in which etching of a $SiO_2$ film, a surface modification treatment, and etching of a SiN film are performed in-situ using a cluster-type processing system as the processing system 200 is described, but these processes may be performed ex-situ using respective apparatuses for individual processes.

Figure 14:
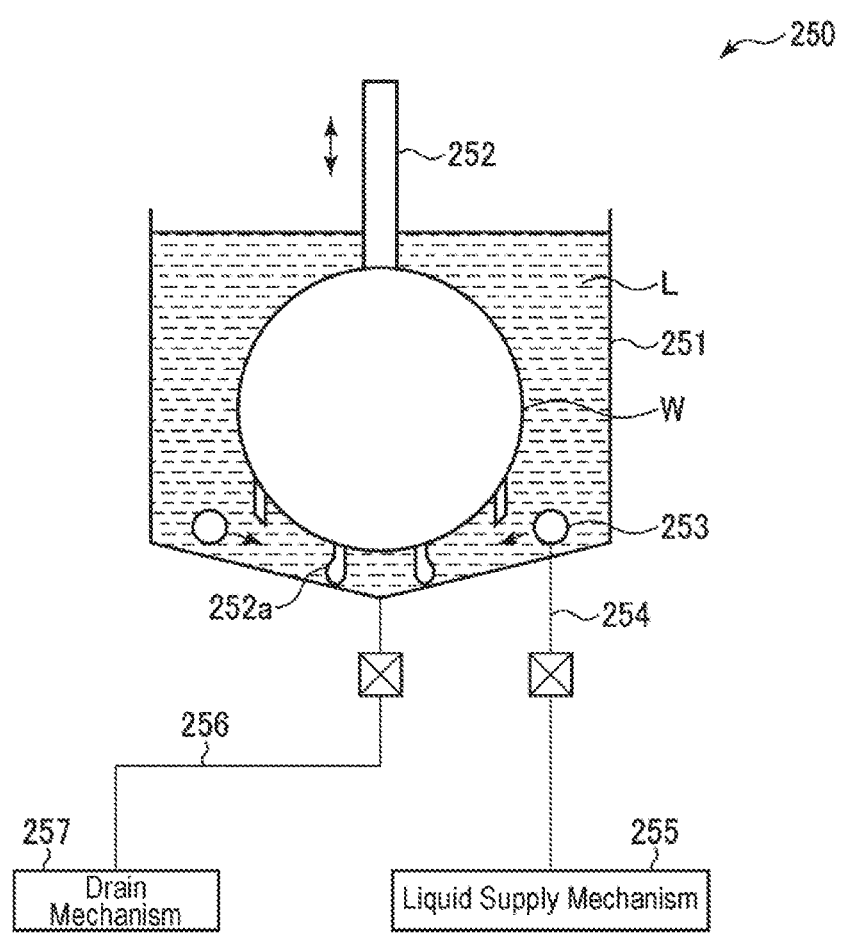
FIG. 14 is a cross-sectional view illustrating another exemplary surface modification treatment apparatus.

In addition, as described above, in the case in which the surface modification treatment is performed by a wet treatment, as an example of the surface modification treatment apparatus, the surface modification treatment apparatus 250 illustrated in FIG. 14 may be used. As illustrated in this drawing, the surface modification treatment apparatus 250 has a liquid processing tank 251 for storing and processing liquid L. A plurality of wafers W held by a wafer holding member 252 are immersed in the liquid L stored in the liquid processing tank 251. The wafer holding member 252 has a plurality of wafer holding bars 252a, and the plurality of wafers W are held and supported by these wafer holding bars 252a. The wafer holding member 252 moves up and down and moves horizontally by a transport apparatus (not illustrated) so as to transport the plurality of wafers W held and supported by the wafer holding member 252.

A nozzle 253 is provided in the liquid processing tank 251, and a liquid supply pipe 254 is connected to the nozzle 253. A predetermined liquid is capable of being supplied from the liquid supply mechanism 255 to the liquid supply pipe 254.

A drain pipe 256 is connected to the bottom portion of the liquid processing tank 251, and the liquid in the liquid processing tank 251 is drained via the drain pipe 256 by a drain mechanism 257.

As the surface modification treatment, when treatment with liquid $H_2O$ (pure water) is performed, pure water is used as the liquid supplied from the liquid supply mechanism 255. When a treatment, which includes a step of adsorbing a surfactant on a wafer surface and a wet cleaning step using $H_2O$ (pure water), is performed as the surface modification treatment, the pure water and the surfactant are used as the liquids supplied from the liquid supply mechanism 255. The pure water and the surfactant are selectively supplied, or two types of liquid processing tank 251 for pure water and a surfactant are prepared.

In the surface modification treatment apparatus 250 configured as described above, when the surface modification treatment is a treatment using liquid $H_2O$ (pure water), the surface modification treatment is performed by immersing the plurality of wafers W in the pure water in a state in which pure water is supplied into and stored in the liquid processing tank 251. Furthermore, when the surface modification treatment is a treatment, which includes a step of adsorbing a surfactant on the wafer surface and a wet cleaning step using $H_2O$ (pure water), the surface modification treatment is performed as follows. First, a surfactant is supplied into and stored in the liquid processing tank 251, the plurality of wafers W are immersed in the surfactant, and then the plurality of wafers W are immersed in the pure water in a state in which the liquid supplied into the liquid processing tank 251 is switched into pure water and the pure water is stored. Alternatively, the plurality of wafers W are immersed in the pure water in a state in which pure water is supplied into and stored in another liquid processing tank 251.

Figure 15:
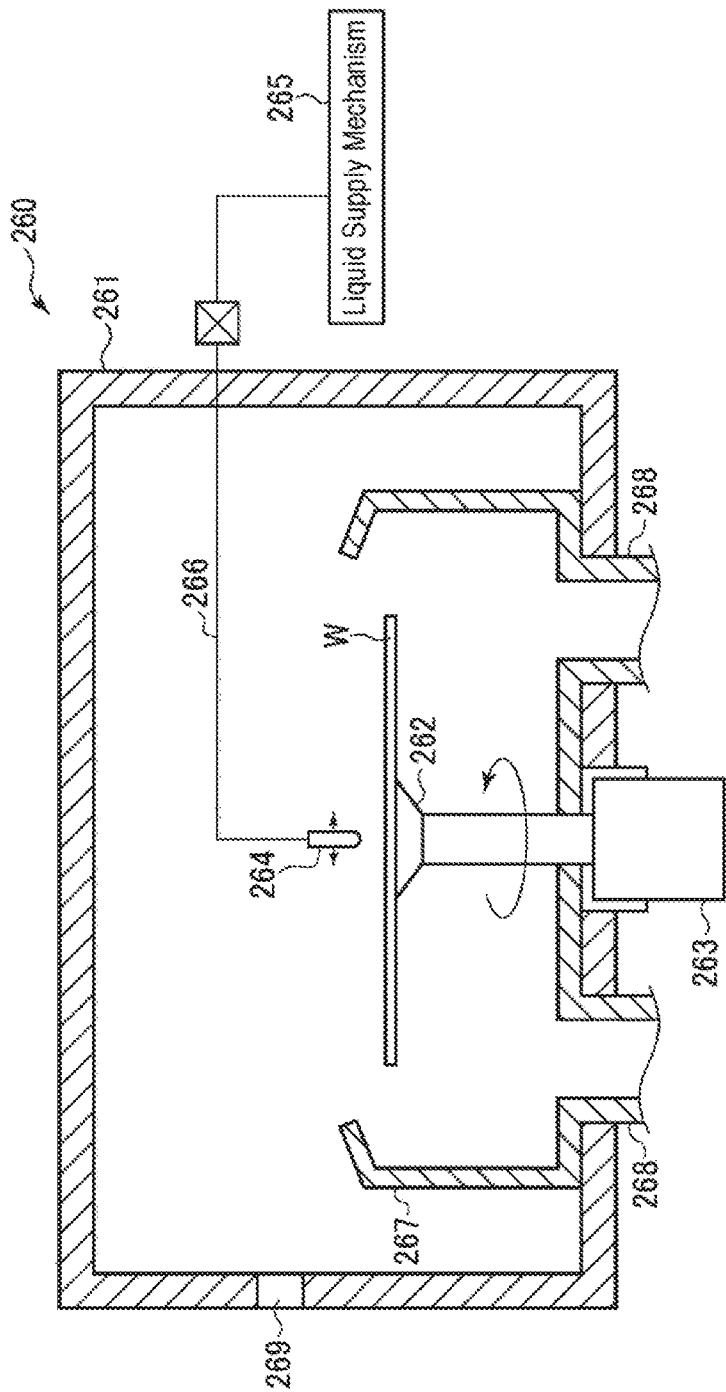
FIG. 15 is a cross-sectional view illustrating a still another exemplary surface modification treatment apparatus.

As another example of the surface modification treatment apparatus in the case in which surface modification treatment is performed by wet treatment, the surface modification treatment apparatus illustrated in FIG. 15 may be used. As illustrated in this drawing, the surface modification treatment apparatus 260 includes a chamber 261, a spin chuck 262, a motor 263, a nozzle 264, and a liquid supply mechanism 265. The spin chuck 262 is rotatable while holding a wafer W in the chamber 261, and the motor 263 rotates the spin chuck 262. The nozzle 264 ejects a liquid onto the wafer W held by the spin chuck 262. The liquid supply mechanism 265 supplies the liquid to the nozzle 264. The liquid is supplied from the liquid supply mechanism 265 to the nozzle 264 through a liquid supply pipe 266. A predetermined liquid is adapted to be capable of being supplied from the liquid supply mechanism 265.

As the surface modification treatment, when treatment with liquid $H_2O$ (pure water) is performed, pure water is used as the liquid supplied from the liquid supply mechanism 265. When a treatment, which includes a step of adsorbing a surfactant on a wafer surface and a wet cleaning step using $H_2O$ (pure water), is performed as the surface modification treatment, pure water and the surfactant are used as the liquids supplied from the liquid supply mechanism 265, and are capable of being selectively supplied.

A cup 267 for covering the wafer W held by the spin chuck 262 is installed in the chamber 261. An exhaust/drain pipe 268 for exhausting and draining is provided in the bottom portion of the cup 267 so as to extend below the chamber 261. A loading/unloading port 269 is formed in the side wall of the chamber 261 so as to load/unload a wafer W therethrough.

In the surface modification treatment apparatus 260 configured as described above, a single wafer W is loaded into the chamber 261 by a transport apparatus (not illustrated) and mounted on the spin chuck 262. In this state, while the wafer is rotated together with the spin chuck 262 by the motor 263, the liquid is ejected through the liquid supply pipe 266 and the nozzle 264 from the liquid supply mechanism 265, such that the liquid is supplied to the entire surface of the wafer W.

When the surface modification treatment is performed using liquid $H_2O$ (pure water), the surface modification treatment is performed by supplying pure water from the liquid supply mechanism 265 onto the rotating wafer W via the liquid supply pipe 266 and the nozzle 264, and this allows the pure water to spread over the entire surface of the wafer W.

When a treatment, which includes a step of adsorbing a surfactant on the wafer surface and a wet cleaning step using $H_2O$ (pure water), is performed as the surface modification treatment, the surface modification treatment is performed as follows. First, a surfactant is supplied from the liquid supply mechanism 265 to the rotating wafer W via the liquid supply pipe 266 and the nozzle 264, and the surfactant is spread and adsorbed on the entire surface of the wafer W. Next, the liquid supplied from the liquid supply mechanism 265 is switched to pure water, and the pure water is supplied onto the wafer to perform wet cleaning.

TEST EXAMPLE

Next, test examples of the present disclosure will be described.

Test Example 1

Here, a SiN film formed through CVD using dichlorosilane ($Si_2H_2Cl_2$) gas and $NH_3$ gas, a thermal oxide film ($SiO_2$ film), and a polysilicon film were etched. Etching was performed using HF gas as an etching gas while changing the temperature and the pressure. The etching conditions were as follows: flow rate of HF gas of 1,500 sccm, pressure of 30 Torr (4,000 Pa) and 50 Torr (6,665 Pa), and temperature of 50 to 150 degrees C.

Figure 16:
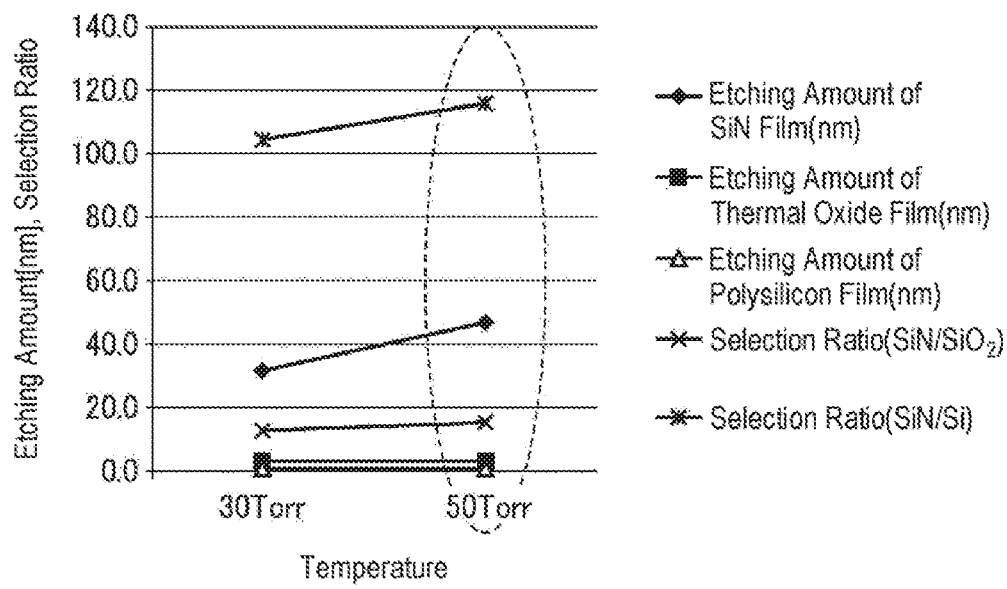
FIG. 16 is a graph representing, in a test example when a SiN film, a thermal oxide film, and a polysilicon film were etched at a temperature of 70 degrees C. while changing pressure, a relationship between the pressure, the etching amount (nm) of each film, the selection ratio of the SiN film to the thermal oxide film, and the selection ratio of the SiN film to the polysilicon film.

FIG. 16 is a graph representing a relationship between pressure, the etching amount (nm) of each film, the selection ratio of an SiN film to a thermal oxide film, and the selection ratio of an SiN film to a polysilicon film when the temperature was 70 degrees C. In addition, FIG. 17 is a graph representing a relationship between pressure, the etching amount (nm) of each film, and the selection ratio of a SiN film to a thermal oxide film and a polysilicon film when the pressure was 50 Torr.

As illustrated in FIG. 16, it can be seen that, as the pressure increases, the etching amount of the SiN film increases, and thus the selection ratio of the SiN film to the thermal oxide film and the selection ratio of the SiN film to the polysilicon film increase. In addition, as illustrated in FIG. 17, it can be seen that the temperature range of 50 to 120 degrees C. is an allowable range of the selection ratio and that, in particular, the etching amount of the SiN film increases at 70 degrees C., and thus the selection ratio of the SiN film to the thermal oxide film and the selection ratio of the SiN film to the polysilicon film increase. At a pressure of 50 Torr and a temperature of 70 degrees C., for the selection ratio of the SiN film to the thermal oxide film, a high value of 15 or more was obtained and for the selection ratio of the SiN film to the polysilicon, a high value of 100 or more was obtained.

Figure 17:
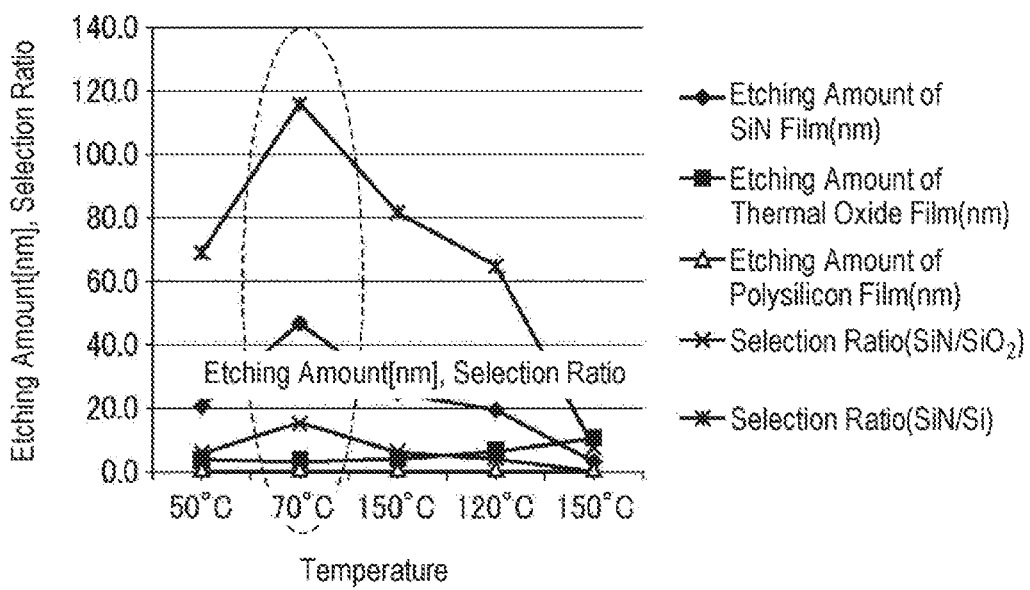
FIG. 17 is a graph representing, in a test example when a SiN film, a thermal oxide film, and a polysilicon film were etched at a pressure of 50 Torr while changing temperature, a relationship between the temperature, the etching amount (nm) of each film, the selection ratio of the SiN film to the thermal oxide film, and the selection ratio of the SiN film to the polysilicon film.

Although not illustrated in FIGS. 16 and 17, the SiGe film showed the same tendency as the polysilicon film, and for the selection ratio of the SiN film to the SiGe film, a high value of 100 or more was obtained at a pressure of 50 Torr and a temperature of 70 degrees C.

Test Example 2

Here, on a wafer having a $SiO_2$ film formed through CVD, COR processing of the $SiO_2$ film using HF gas and $NH_3$ gas was performed under the following conditions: a pressure of 333 Pa (2.5 Torr) and a temperature of 100 degrees C. Next, AFS was removed through a heat treatment at 250 degrees C., and etching of the $SiO_2$ film was performed. Thereafter, a sample (sample 1) was prepared by performing a treatment under the etching conditions of the SiN film (HF gas treatment+heat treatment) on the wafer as it was. Moreover, a sample (sample 2) obtained by performing a pure water treatment and then performing a treatment under the etching conditions of the SiN film, and a sample (sample 3) obtained by performing a step of absorbing a surfactant, a wet cleaning step with $H_2O$ (pure water) and then performing a treatment under the etching conditions of the SiN film were also prepared. For these samples, the surface states of the $SiO_2$ films were investigated.

The treatment at the etching conditions of the SiN film was performed as follows: a gas treatment was performed under the following conditions: flow rate of HF gas of 2,000 sccm, pressure of 1,333 to 1,995 Pa (10 to 15 Torr), and temperature of 50 to 75 degrees C., after which heat treatment was performed at 250 degrees C.

As a result, in sample 1, many pitting defects occurred on the surface of the $SiO_2$ film and the surface roughness was poor, but in sample 2, the number of pitting defects on the surface of the $SiO_2$ film surface decreased by about 20%, and the surface roughness also improved. In sample 3, no pitting defects were observed on the surface of the $SiO_2$ film, and the surface roughness was further improved.

Other Applications

Although embodiments have been described above, it should be understood that the embodiments disclosed herein are illustrative and non-restrictive in all respects. The above embodiments may be omitted, replaced, or modified in various forms without departing from the scope and spirit of the appended claims. In addition, the various embodiments described above may be suitably combined and implemented.

For example, the structure examples of the above embodiments are merely examples, and any structure is applicable as long as a SiN film coexists with $SiO_2$, Si, and SiGe. In addition, the structure of the processing system and the individual apparatuses are merely examples, and the etching method of the present disclosure can be performed by systems and apparatuses having various configurations.

EXPLANATION OF REFERENCE NUMERALS 11, 21, 31: silicon substrate, 12, 22a, 22b, 22c, 32: Si film, 13, 23, 33: SiGe film, 14, 16, 25, 35: SiO2 film, 15, 26, 34: SiN film, 100, 200: processing system, 105: etching apparatus, 202: oxide film etching apparatus, 203, 250, 260: surface modification treatment apparatus, 204: SiN film etching apparatus, W: Wafer

What is claimed is:

1. An etching method comprising:
disposing a substrate in a chamber, the substrate having a silicon nitride film, a silicon oxide film, silicon, and silicon germanium;
setting a pressure in the chamber to a predetermined pressure, which is higher than 1,333 Pa and is lower than 5,332 Pa; and
selectively etching and removing the silicon nitride film from the substrate while maintaining the silicon oxide film, the silicon, and the silicon germanium on the substrate by supplying a hydrogen fluoride gas into the chamber while the pressure in the chamber is maintained at the predetermined pressure.

2. The etching method of claim 1, wherein an etching selectivity ratio of the silicon nitride film to the silicon oxide film is 5 or more.

3. The etching method of claim 1, wherein an etching selectivity ratio of the silicon nitride film to the silicon and the silicon germanium is 50 or more.

4. The etching method of claim 1, wherein a temperature of the substrate is set to 10 to 120 degrees C.

5. The etching method of claim 4, wherein the temperature of the substrate is set to 30 to 80 degrees C.

6. An etching method for selectively etching a silicon nitride film with respect to a substrate having the silicon nitride film, a silicon oxide film, silicon and silicon germanium, the etching method comprising:

performing a surface modification treatment with respect to the substrate so as to remove an impurity in a film; and subsequently, selectively etching and removing the silicon nitride film from the substrate while maintaining the silicon oxide film, the silicon, and the silicon germanium on the substrate by supplying HF gas to the substrate, which has been subjected to the surface modification treatment, while keeping the substrate under a predetermined pressure, which is higher than 1,333 Pa and is lower than 5,332 Pa.

7. The etching method of claim 6, wherein the silicon oxide film is etched prior to the surface modification treatment.

8. The etching method of claim 6, wherein the surface modification treatment is performed through a heat treatment at a temperature ranging from 150 to 400 degrees C. in an inert gas atmosphere.

9. The etching method of claim 6, wherein the surface modification treatment is performed through a reaction treatment using $H_2O$ at a temperature ranging from 20 to 100 degrees C.

10. The etching method of claim 6, wherein the surface modification treatment includes a step of adsorbing a surfactant on a surface of the substrate, and a wet cleaning step using $H_2O$.

11. The etching method of claim 6, wherein a temperature of the substrate when etching the silicon nitride film is set to 10 to 120 degrees C.

12. The etching method of claim 11, wherein the temperature of the substrate when etching the silicon nitride film is set to 30 to 80 degrees C.

13. An etching method of etching a substrate having a silicon nitride film, a silicon oxide film, silicon, and silicon germanium, the etching method comprising:

first, etching the silicon oxide film;

subsequently, performing a surface modification treatment for removing an impurity in a film and a byproduct in a surface of the substrate; and subsequently, selectively etching and removing the silicon nitride film from the substrate while maintaining the silicon oxide film, the silicon, and the silicon germanium on the substrate by supplying a HF gas to the substrate, which has been subjected to the surface modification treatment, while keeping the substrate under a predetermined pressure which is higher than 1,333 Pa and is lower than 5,332 Pa.

14. The etching method of claim 13, wherein the etching of the silicon oxide film is performed using a HF gas and an $NH_3$ gas.

15. The etching method of claim 13, wherein the etching of the silicon oxide film is performed by a radical treatment.

* * * * *